United States Patent
Wang et al.

(10) Patent No.: US 11,929,361 B2
(45) Date of Patent: Mar. 12, 2024

(54) INTEGRATED CIRCUIT AND MANUFACTURING METHOD THEREOF

(71) Applicants: TAIWAN SEMICONDUCTOR MANUFACTURING CO., LTD., Hsinchu (TW); TSMC China Company Limited, Shanghai (CN)

(72) Inventors: Xin-Yong Wang, Shanghai (CN); Li-Chun Tien, Tainan (TW); Chih-Liang Chen, Hsinchu (TW)

(73) Assignees: TAIWAN SEMICONDUCTOR MANUFACTURING CO., LTD., Hsinchu (TW); TSMC CHINA COMPANY LIMITED, Shanghai (CN)

(*) Notice: Subject to any disclaimer, the term of this patent is extended or adjusted under 35 U.S.C. 154(b) by 0 days.

(21) Appl. No.: 17/873,935

(22) Filed: Jul. 26, 2022

(65) Prior Publication Data

US 2022/0359493 A1    Nov. 10, 2022

Related U.S. Application Data

(62) Division of application No. 17/108,635, filed on Dec. 1, 2020, now Pat. No. 11,469,221.

(30) Foreign Application Priority Data

Nov. 13, 2020 (CN) .......................... 202011271727.5

(51) Int. Cl.
*H01L 27/02* (2006.01)
*H01L 21/768* (2006.01)
*H01L 23/522* (2006.01)

(52) U.S. Cl.
CPC .... *H01L 27/0207* (2013.01); *H01L 21/76816* (2013.01); *H01L 23/5226* (2013.01)

(58) Field of Classification Search
CPC ........... H01L 27/0207; H01L 21/76816; H01L 23/5226
(Continued)

(56) References Cited

U.S. PATENT DOCUMENTS 9,106,490 B2    8/2015  Wang et al.
9,209,247 B2    12/2015 Colinge et al.
(Continued)

OTHER PUBLICATIONS

U.S. Appl. No. 16/909,968, filed Jun. 23, 2020, Wang et al.

*Primary Examiner* — Tu-Tu V Ho
(74) *Attorney, Agent, or Firm* — Birch, Stewart, Kolasch & Birch, LLP

(57) ABSTRACT

An integrated circuit includes a first transistor, a second transistor, a first power line, and a second power line. The first transistor has a first active region and a first gate structure, in which the first active region has a source region and a drain region on opposite sides of the first gate structure. The second transistor is below the first transistor, and has a second active region and a second gate structure, in which the second active region has a source region and a drain region on opposite sides of the second gate structure. The first power line is above the first transistor, in which the first power line is electrically connected to the source region of first active region. The second power line is below the second transistor, in which the second power line is electrically connected to the source region of second active region.

20 Claims, 25 Drawing Sheets

(58) Field of Classification Search
USPC .......................................................... 257/401
See application file for complete search history.

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,412,817 | B2 | 8/2016 | Yang et al. |
| 9,412,828 | B2 | 8/2016 | Ching et al. |
| 9,443,769 | B2 | 9/2016 | Wang et al. |
| 9,472,618 | B2 | 10/2016 | Oxland |
| 9,502,256 | B2 | 11/2016 | Jiang et al. |
| 9,520,482 | B1 | 12/2016 | Chang et al. |
| 9,536,738 | B2 | 1/2017 | Huang et al. |
| 9,548,366 | B1 | 1/2017 | Ho et al. |
| 9,570,395 | B1 | 2/2017 | Sengupta et al. |
| 9,576,814 | B2 | 2/2017 | Wu et al. |
| 9,608,116 | B2 | 3/2017 | Ching et al. |
| 9,831,183 | B2 | 11/2017 | Lin et al. |
| 9,859,386 | B2 | 1/2018 | Ho et al. |
| 2006/0220134 | A1* | 10/2006 | Huo .................... H01L 27/1203 257/351 |
| 2009/0166745 | A1 | 7/2009 | Takeuchi |
| 2012/0276736 | A1 | 11/2012 | Idani |
| 2018/0006009 | A1* | 1/2018 | Lin ....................... G06F 30/392 |
| 2018/0374791 | A1 | 12/2018 | Smith et al. |
| 2019/0139891 | A1 | 5/2019 | Ohtou et al. |
| 2019/0393356 | A1 | 12/2019 | Le et al. |
| 2020/0006388 | A1 | 1/2020 | Dewey et al. |
| 2020/0083288 | A1 | 3/2020 | Kanaya |
| 2020/0135644 | A1 | 4/2020 | Lin et al. |

\* cited by examiner

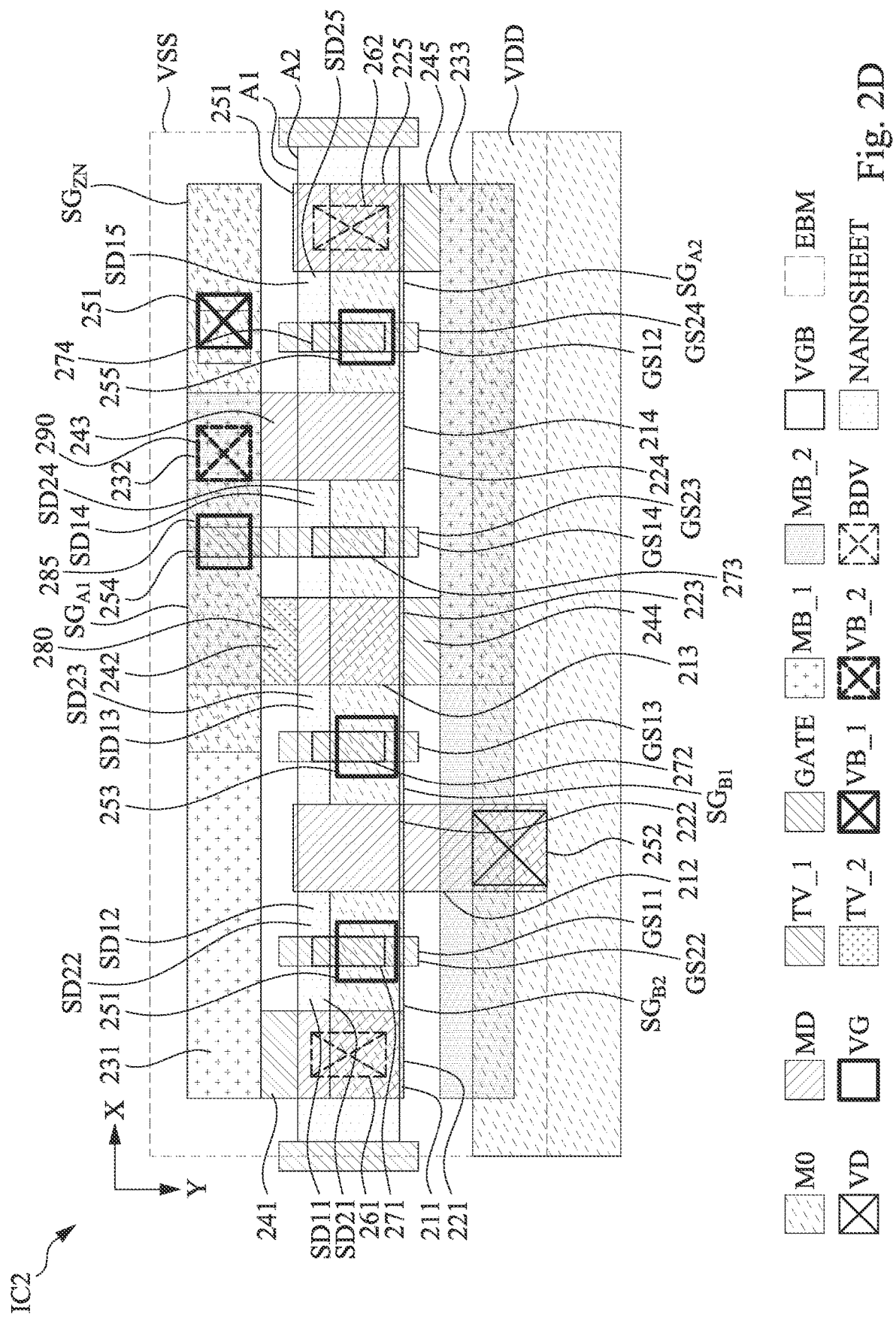

INTEGRATED CIRCUIT AND MANUFACTURING METHOD THEREOF

CROSS-REFERENCE TO RELATED APPLICATION

The present application is a Divisional application of U.S. patent application Ser. No. 17/108,635, filed on Dec. 1, 2020, which claims priority of China Patent Application No. 202011271727.5, filed on Nov. 13, 2020, which are hereby incorporated herein by references.

BACKGROUND

As integrated circuits become smaller, layouts for the integrated circuits are changed to decrease the overall area occupied by an integrated circuit. Decreasing the area of the layout is accomplished by substituting new structures for integrated circuit elements that are smaller than previous versions of integrated circuit elements. Decreasing the area of the layout is also accomplished by reducing the distance between circuit elements in a layer of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2B-2D are plane views of an integrated circuit in accordance with some embodiments of the present disclosure.

DETAILED DESCRIPTION

Figure 1A:
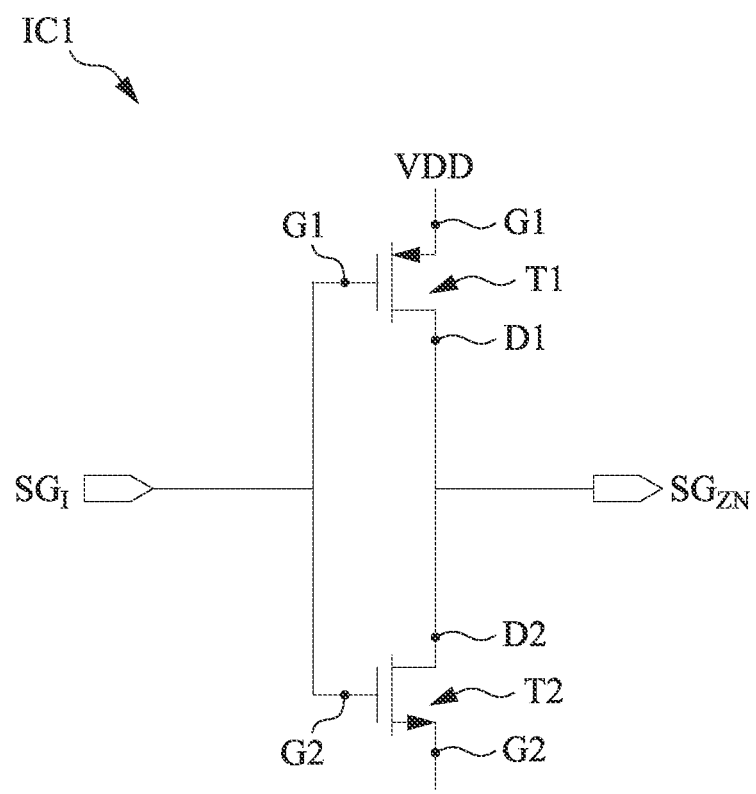
FIG. 1A is an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
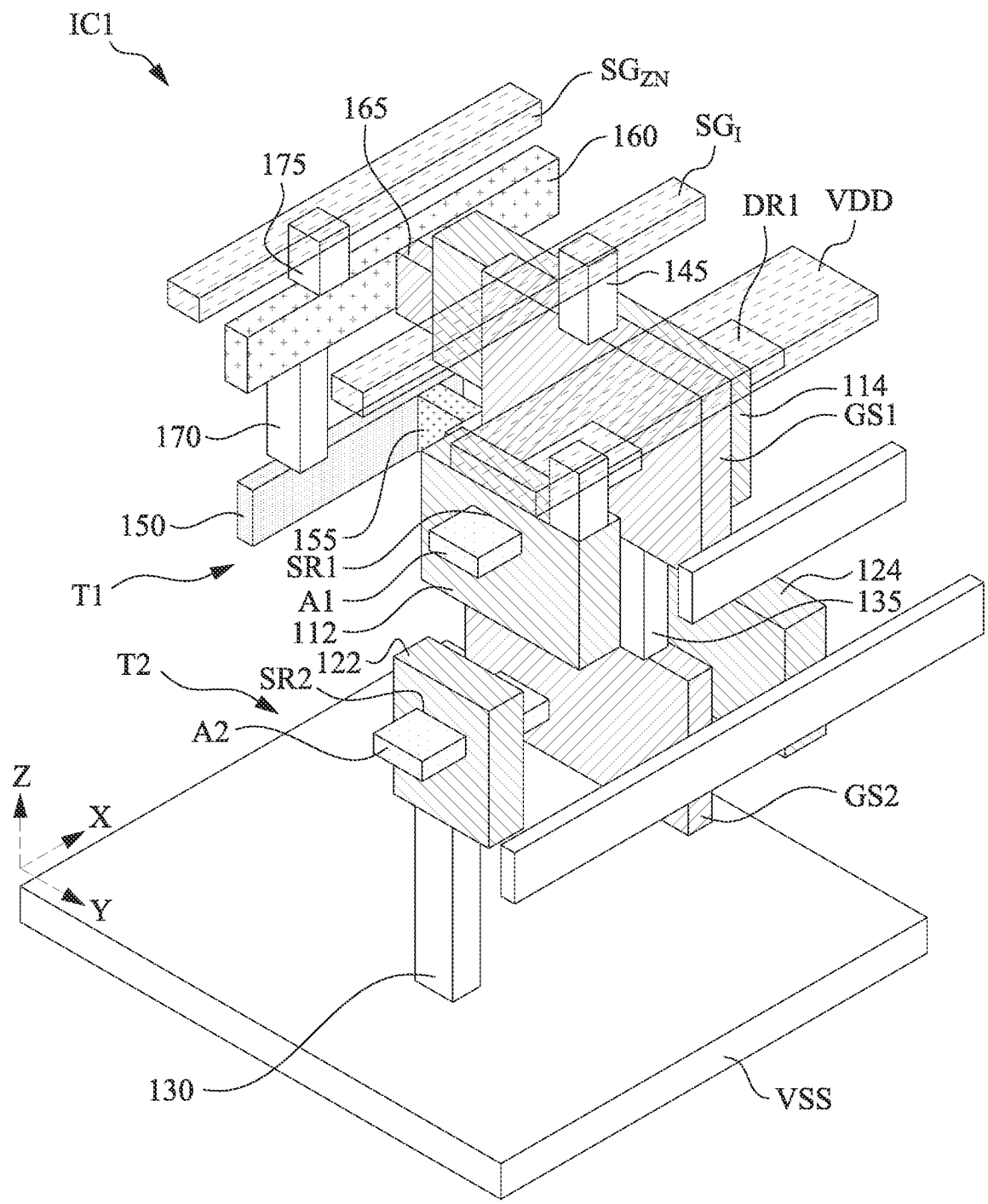
FIG. 1B is a schematic view of an integrated circuit in accordance with some embodiments of the present disclosure.
Figure 1B:
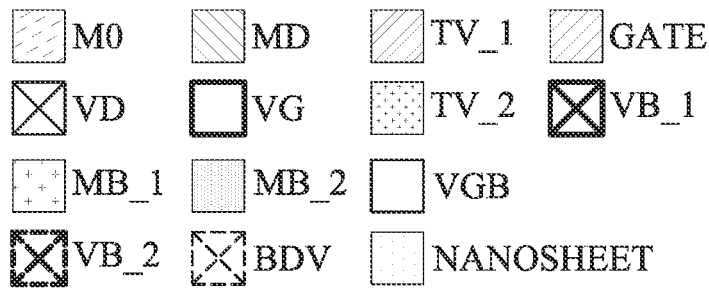
Figure 1C:
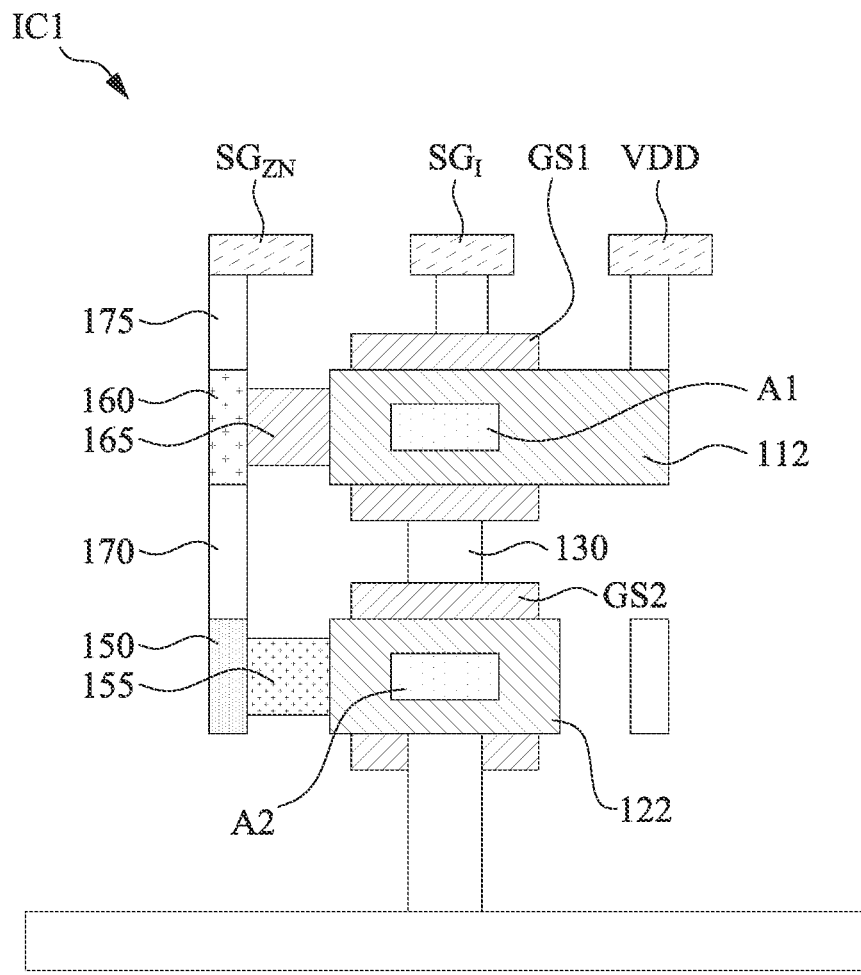
FIG. 1C is a side view of an integrated circuit in accordance with some embodiments of the present disclosure.
Figure 1C:
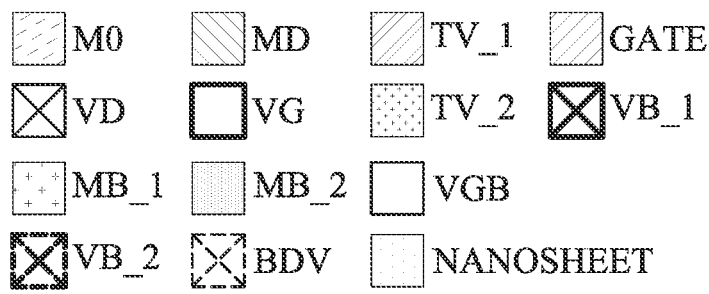
Figure 1D:
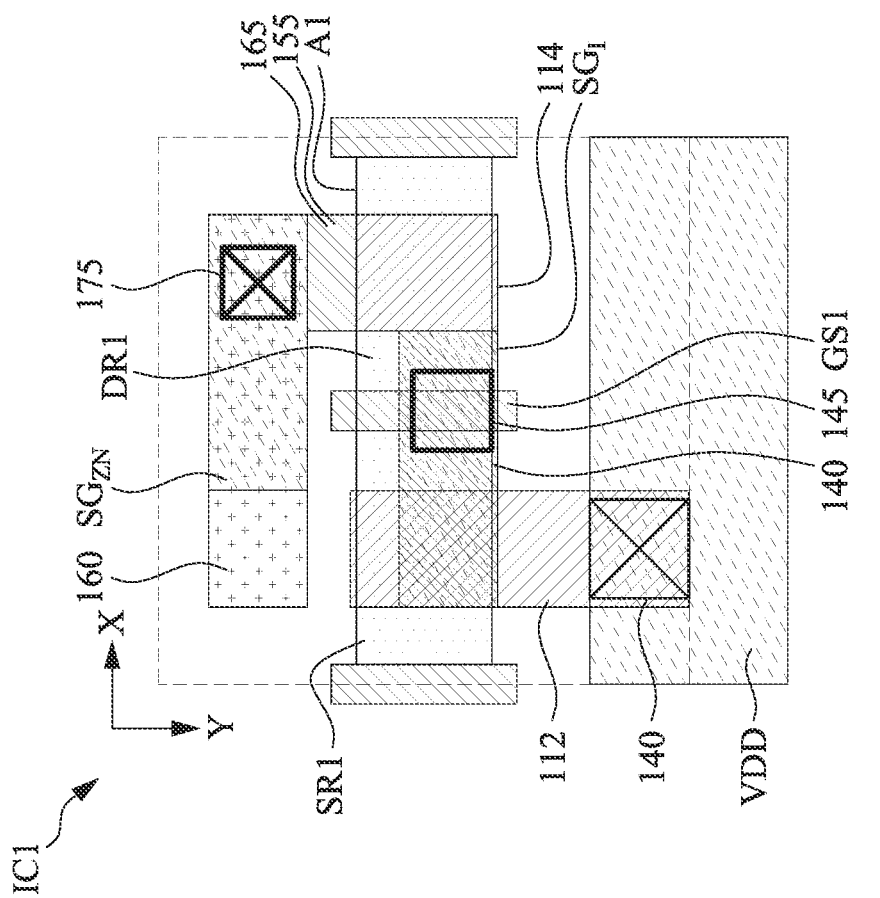
FIGS. 1D-1F are plane views of an integrated circuit in accordance with some embodiments of the present disclosure.
Figure 1E:
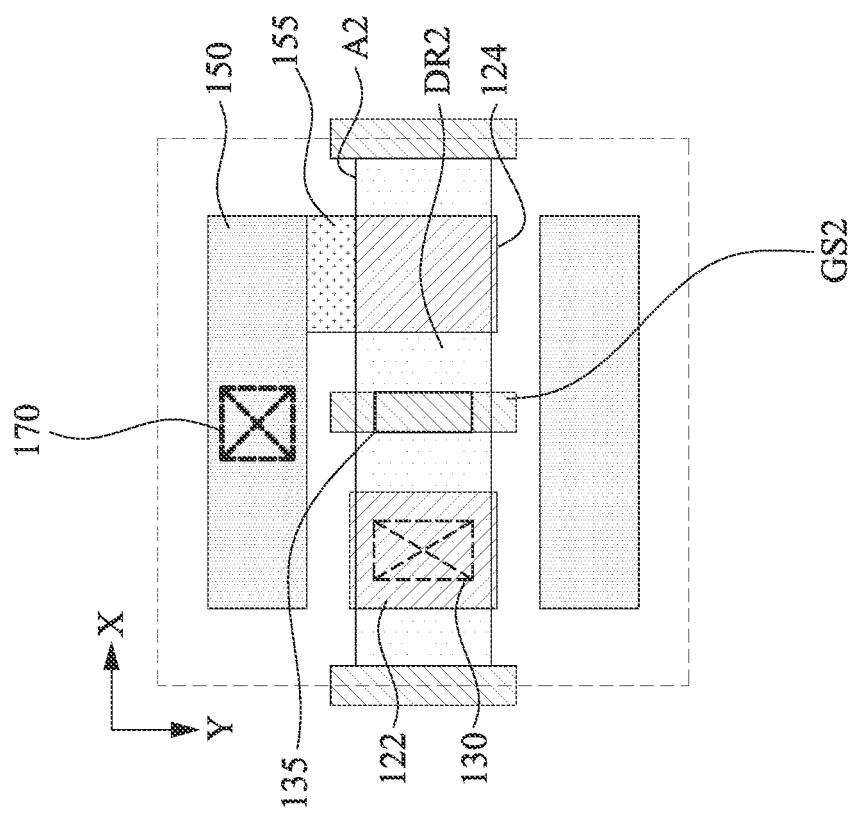
Figure 1F:
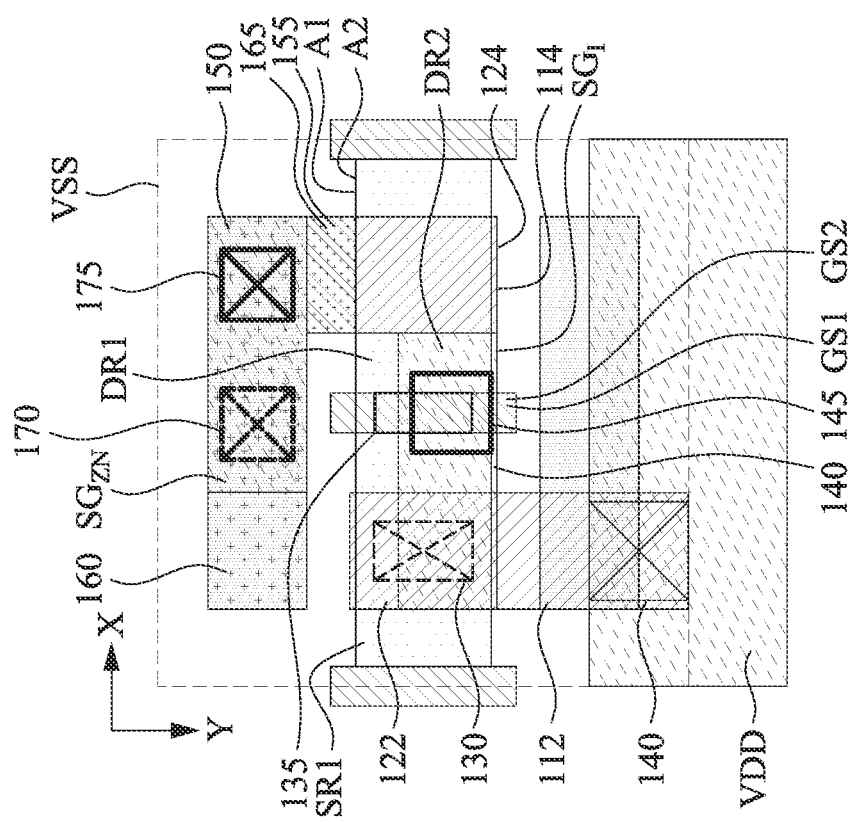

FIG. 1A is an integrated circuit in accordance with some embodiments of the present disclosure. FIG. 1B is a schematic view of an integrated circuit in accordance with some embodiments of the present disclosure. FIG. 1C is a side view of an integrated circuit in accordance with some embodiments of the present disclosure. FIGS. 1D-1F are plane views of an integrated circuit in accordance with some embodiments of the present disclosure.

Reference is made to FIG. 1A. Shown there is an integrated circuit IC1. The integrated circuit IC1 includes a first transistor T1 and a second transistor T2. In some embodiments, the first transistor T1 and the second transistor T2 are Metal-Oxide-Semiconductor Field-Effect Transistor (MOSFET). In some embodiments, the first transistor T1 and the second transistor T2 have different conductivity types. As an example of FIG. 1A, the first transistor T1 may be a p-type transistor, such as a PFET, and the second transistor T2 may be an n-type transistor, such as an NFET. However, in some other embodiments, the first transistor T1 can be an n-type transistor, such as an NFET, and the second transistor T2 can be a p-type transistor, such as a PFET.

In some embodiments, the first transistor T1 includes a gate G1, a source S1, and a drain D1. On the other hand, the second transistor T2 includes a gate G2, a source S2, and a drain D2. The first transistor T1 and the second transistor T2 are electrically coupled to each other. The first and second transistors T1 and T2 can be in combination serve a complementary FET (CFET) device. For example, the gate G1 of the first transistor T1 and the gate G2 of the second transistor T2 are electrically coupled, and are electrically coupled to a signal line $SG_I$. On the other hand, the drain D1 of the first transistor T1 and the drain D2 of the second transistor T2 are electrically coupled, and are electrically coupled to a signal line $SG_{ZN}$. The source S1 of the first transistor T1 is electrically coupled to a power line VDD, and the source S2 of the second transistor T2 is electrically coupled to a power line VSS. In some embodiments, when in operation of the integrated circuit IC1, a high level voltage (e.g., positive voltage) is applied to the power line VDD, and a low level voltage (e.g., ground voltage or negative voltage) is applied to the power line VSS.

It is noted that, if the first transistor T1 is an n-type transistor, such as an NMOS, and the second transistor T2 is a p-type transistor, such as a PMOS. The power line VDD and power line VSS discussed in this content may be exchanged to power line VSS and power line VDD, respectively, in which a high level voltage is applied to the power line VDD, and a low level voltage is applied to the power line VSS.

Reference is made to FIGS. 1B to 1F, in which FIG. 1B is a schematic view of the integrated circuit IC1 of FIG. 1A, FIG. 1C is a side view of FIG. 1B. On the other hand, FIG. 1D is a plane view which illustrates an upper part of the integrated circuit IC1 of FIG. 1A, and FIG. 1E is a plane view which illustrates a lower part of the integrated circuit IC1 of FIG. 1A. FIG. 1F is a plane view of the whole integrated circuit IC1 of FIG. 1A. In detail, the plane view of FIG. 1F includes the plane view of FIG. 1D stacking over the plane view of FIG. 1E.

The integrated circuit IC1 includes an active region A1 and an active region A2 extending along the X direction. The integrated circuit IC1 further includes a gate structure GS1 and a gate structure GS2 extending along the Y direction. In some embodiments, the gate structure GS1 wraps around four sides of the active region A1 (i.e., top side, bottom side and opposite lateral sides connecting the top and bottom sides), and the gate structure GS2 wraps around four sides of the active region A2. That is, the gate structures GS1 and GS2 are in contact with at least four sides of the active region A1 and A2, respectively. As a result, the structure discussed herein can be referred to as a gate-all-around (GAA) structure. In some embodiments, the active regions A1 and A2 may be referred to as "nanosheets" or "nanowires" used to form a channel region of the GAA device discussed herein. In some embodiments, the active region A1 includes a source region SR1 and a drain region DR1 on opposite sides of the gate structures GS1, which may be clearly seen at FIG. 1D. On the other hand, the active region A2 includes a source region SR2 and a drain region DR2 on opposite sides of the gate structures GS2, which can be clearly seen at FIG. 1E. In some embodiments, the active region A1 and the active region A2 are identified in the legend in the drawings (FIGS. 1D to 1F) with label "NANOSHEET." In some embodiments, the gate structures GS1 and GS2 are identified in the legend in the drawings (FIGS. 1D to 1F) with label "GATE."

The gate structure GS1 and the active region A1, which includes the source region SR1 and the drain region DR1, form a first transistor T1 that corresponds to the first transistor T1 as illustrated in FIG. 1A. In some embodiments, the gate structure GS1, the source region SR1, and the drain region DR1 of FIGS. 1B to 1F correspond to the gate G1, source S1, and the drain D1 of FIG. 1A, respectively. Similarly, the gate structure GS2 and the active region A2, which includes the source region SR2 and the drain region DR2, form a second transistor T2 that corresponds to the second transistor T2 as illustrated in FIG. 1A. In some embodiments, the gate structure GS2, the source region SR2, and the drain region DR2 of FIGS. 1B to 1F correspond to the gate G2, source S2, and the drain D2 of FIG. 1A, respectively. As shown in FIGS. 1B to 1F, the first transistor T1 is stacked over the second transistor T2 along the vertical direction (e.g., Z direction). Moreover, as mentioned above, the first transistor T1 and the second transistor T2 are GAA structures, and thus the transistors T1 and T2 can interchangeably referred to as GAA transistors T1 and T2. Also, the first transistor T1 is a p-type transistor, and the second transistor T2 is an n-type transistor. However, in other embodiments, the first transistor T1 can be an n-type transistor, and the second transistor T2 can be a p-type transistor.

In some embodiments, the active regions A1 and A2 are made of semiconductor material, such as silicon, or other suitable semiconductor materials. In some embodiments, the gate structures GS1 and GS2 may include polycrystalline silicon (polysilicon). In some other embodiments, the gate structures GS1 and GS2 may be metal gate structures. Each of the metal gate structures may include a gate dielectric layer, a work function metal layer, and a filling metal. The gate dielectric layer may include high-K dielectrics, such as $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $AlSiO$, $HfTaO$, $HfTiO$, $(Ba,Sr)TiO_3$ (BST), $Al_2O_3$, $Si_3N_4$, oxynitrides (SiON), combinations thereof, or other suitable material. The work function metal layer may be a p-type work function layers for p-type device (e.g., the first transistor T1), or an n-type work function layers for n-type device (e.g., the second transistor T2). Exemplary p-type work function metals include TiN, TaN, Ru, Mo, Al, WN, $ZrSi_2$, $MoSi_2$, $TaSi_2$, $NiSi_2$, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. In some embodiments, the filling metal may include tungsten (W). In some other embodiments, the gate electrode includes aluminum (Al), copper (Cu) or other suitable conductive material.

The source region SR1 and drain region DR1 are doped semiconductor regions in the active region A1, and are on opposite sides of the corresponding gate structure GS1. Similarly, the source region SR2 and drain region DR2 are doped semiconductor regions in the active region A2, and are on opposite sides of the corresponding gate structure GS2. In some embodiments, because the first transistor T1 is a p-type device, the source region SRI and drain region DR1 may include p-type dopants such as boron for formation of p-type FETs. In other embodiments, because the second transistor T2 is an n-type device, the source region SRI and drain region DR1 may include n-type dopants such as phosphorus for formation of n-type FETs. In some other embodiments, the source region SRI, drain region DR1, the source region SR2, and the drain region DR2 may be epitaxially grown regions.

A source contact 112 wraps around four sides of the source region SR1 of the active region A1, and a drain contact 114 wraps around four sides of the drain region DR1 of the active region A1. On the other hand, a source contact 122 wraps around four sides of the source region SR2 of the active region A2, and a drain contact 124 wraps around four sides of the drain region DR2 of the active region A2. In some embodiments, each of the source contact 112, the drain contact 114, the source contact 122, and the drain contact 124 may include a liner and a plug lined with the liner. In some embodiments, the liner may include titanium (Ti), titanium nitride (TiN), tantalum (Ta), tantalum nitride (TaN), or another suitable material. The plug may include a conductive material, such tungsten (W), copper (Cu), aluminum (Al), ruthenium (Ru), cobalt (Co), molybdenum (Mo), nickel (Ni), or other suitable conductive material. In some embodiments, the source contact 112, the drain contact 114, the source contact 122, and the drain contact 124 are identified in the legend in the drawings (FIGS. 1D to 1F) with label "MD."

The integrated circuit IC1 further includes a via 130 and a power line VSS. The power line VSS is disposed below the second transistor T2. In some embodiments, the via 130 is in contact with the bottom surface of the source contact 122 and the top surface of the power line VSS. That is, the via 130 electrically couples the source contact 122 and the power line VSS. Accordingly, the source region SR2 of the second transistor T2 is electrically coupled to the power line VSS. In some embodiments, the via 130 may include copper (Cu), aluminum (Al), or suitable conductive material. In some embodiments, the power line VSS may include copper (Cu), aluminum (Al), or suitable conductive material. In some embodiments, via 130 is identified in the legend in the drawings (FIGS. 1D to 1F) with label "BDV." In some embodiments, power line VSS is identified in the legend in the drawings (FIGS. 1D to 1F) with label "EBM."

It is noted that the first transistor T1 is a p-type transistor, and the second transistor T2 is an n-type transistor. However, in other embodiments, if the first transistor T1 is an n-type transistor and the second transistor T2 is a p-type transistor, the label power line VSS may be exchanged to power line VDD.

The integrated circuit IC1 further includes a via 135. In some embodiments, the via 135 is in contact with the bottom surface of the gate structure GS1 of the first transistor T1 and the top surface of the gate structure GS2 of the second transistor T2. That is, the via 130 electrically couples the gate structure GS1 of the first transistor T1 to the gate structure GS2 of the second transistor T2. In some embodiments, the via 135 may include copper (Cu), aluminum (Al), or suitable conductive material. In some embodiments, via 135 is identified in the legend in the drawings (FIGS. 1D to 1F) with label "VGB."

The integrated circuit IC1 further includes a via 140 and a power line VDD. The power line VDD is disposed over the first transistor T1. In some embodiments, the via 140 is in contact with the top surface of the source contact 112 and the bottom surface of the power line VDD. That is, the via 140 electrically couples the source contact 112 and the power line VDD. Accordingly, the source region SRI of the first transistor T1 is electrically coupled to the power line VDD. In some embodiments, the via 140 may include copper (Cu), aluminum (Al), or suitable conductive material. In some embodiments, the power line VDD may include copper (Cu), aluminum (Al), or suitable conductive material. In some embodiments, via 140 is identified in the legend in the drawings (FIGS. 1D to 1F) with label "VD." In some embodiments, power line VSS is identified in the legend in the drawings (FIGS. 1D to 1F) with label "M0."

It is noted that the first transistor T1 is a p-type transistor, and the second transistor T2 is an n-type transistor. However, in other embodiments, if the first transistor T1 is an n-type transistor and the second transistor T2 is a p-type transistor, the label power line VDD may be exchanged to power line VSS.

The integrated circuit IC1 further includes a via 145 and a signal line $SG_I$. The signal line $SG_I$ is disposed over the first transistor T1. In some embodiments, the via 145 is in contact with the top surface of the gate structure GS1 of the first transistor T1 and the bottom surface of the signal line $SG_I$. That is, the via 145 electrically couples the gate structure GS1 of the first transistor T1 and the signal line $SG_I$. On the other hand, because the gate structure GS2 of the second transistor T2 is electrically coupled to the gate structure GS1 of the first transistor T1 through the via 135, the gate structure GS2 of the second transistor T2 and the gate structure GS1 of the first transistor T1 are both electrically coupled to the signal line $SG_I$. In some embodiments, the via 145 may include copper (Cu), aluminum (Al), or suitable conductive material. In some embodiments, the signal line $SG_I$ may include copper (Cu), aluminum (Al), or suitable conductive material. In some embodiments, via 145 is identified in the legend in the drawings (FIGS. 1D to 1F) with label "VG." In some embodiments, signal line $SG_I$ is identified in the legend in the drawings (FIGS. 1D to 1F) with label "M0."

The integrated circuit IC1 further includes a via 155 and a metal line 150. In some embodiments, the metal line 150 is adjacent to the second transistor T2 along the Y direction. In some embodiments, the via 155 is in contact with the sidewall of the metal line 150 and the sidewall of the drain contact 124 (can be clearly seen at FIG. 1E). That is, the via 155 electrically couples the metal line 150 to the drain contact 124 as well as the drain region DR2 of the second transistor T2. In some embodiments, the via 155 may include copper (Cu), aluminum (Al), or suitable conductive material. In some embodiments, the metal line 150 may include copper (Cu), aluminum (Al), or suitable conductive material. In some embodiments, via 155 is identified in the legend in the drawings (FIGS. 1D to 1F) with label "TV_2." In some embodiments, metal line 150 is identified in the legend in the drawings (FIGS. 1D to 1F) with label "MB_2."

The integrated circuit IC1 further includes a via 165 and a metal line 160. In some embodiments, the metal line 160 is adjacent to the first transistor T1 along the Y direction. In some embodiments, the via 165 is in contact with the sidewall of the metal line 160 and the sidewall of the drain contact 114 (can be clearly seen at FIG. 1D). That is, the via 165 electrically couples the metal line 160 to the drain contact 114 as well as the drain region DR1 of the first transistor T1. In some embodiments, the via 165 may include copper (Cu), aluminum (Al), or suitable conductive material. In some embodiments, the metal line 160 may include copper (Cu), aluminum (Al), or suitable conductive material. In some embodiments, via 165 is identified in the legend in the drawings (FIGS. 1D to 1F) with label "TV_1." In some embodiments, metal line 160 is identified in the legend in the drawings (FIGS. 1D to 1F) with label "MB_1."

The integrated circuit IC1 further includes a via 170. The via 170 is in contact with the top surface of the metal line 150 and the bottom surface of the metal line 160. That is, the via 170 electrically couples the metal line 150 to the metal line 160. As mentioned above, because the metal line 150 is coupled to the drain region DR2 of the second transistor T2, and the metal line 160 is coupled to the drain region DR1 of the first transistor T1, the drain region DR2 of the second transistor T2 is electrically coupled to the drain region DR1 of the first transistor T1 through the via 170. In some embodiments, the via 170 may include copper (Cu), aluminum (Al), or suitable conductive material. In some embodiments, via 170 is identified in the legend in the drawings (FIGS. 1D to 1F) with label "VB_2."

The integrated circuit IC1 further includes a via 175 and a signal line $SG_{ZN}$. The signal line $SG_{ZN}$ is disposed over the first transistor T1. In some embodiments, the via 175 is in contact with the top surface of the metal line 160 and the bottom surface of the signal line $SG_{ZN}$. That is, the via 175 electrically couples the metal line 160 to the signal line $SG_{ZN}$. As mentioned above, because the drain region DR1 of the first transistor T1 is electrically coupled to the metal line 160, the drain region DR1 of the first transistor T1 is electrically coupled to the signal line $SG_{ZN}$. Moreover, as the drain region DR2 of the second transistor T2 is electrically coupled to the drain region DR1 of the first transistor T1, the drain region DR2 of the second transistor T2 is therefore electrically coupled to the signal line $SG_{ZN}$. In some embodiments, the via 175 may include copper (Cu), aluminum (Al), or suitable conductive material. In some embodiments, the signal line $SG_{ZN}$. may include copper (Cu), aluminum (Al), or suitable conductive material. In some embodiments, via 175 is identified in the legend in the drawings (FIGS. 1D to 1F) with label "VB_1." In some embodiments, signal line $SG_{ZN}$ is identified in the legend in the drawings (FIGS. 1D to 1F) with label "M0."

Referring to FIGS. 1B to 1F, the first transistor T1 is stacked over the second transistor T2 along the vertical direction (e.g., Z direction). The power line VSS is disposed below the second transistor T2 and the power line VDD is disposed above the first transistor T1. That is, the first transistor T1 and the second transistor T2 are between the power line VSS and power line VDD along the vertical direction. Stated another way, the power line VSS and power line VDD are disposed on opposite sides of the first transistor T1 and the second transistor T2 along the vertical direction. Further, the power line VSS has larger area than the power line VDD. As an example in FIG. 1B, along the Y direction, the power line VSS is wider than the power line VDD. In this regard, the power line VSS with larger area can act as a power source for other integrated circuits (not shown), which will improve the routing flexibility.

With this configuration, the power line VSS and power line VDD formed in different layers (levels) can reduce the cell height and also improve power grid distribution. On the other hand, the power line VSS below the second transistor T2 can be formed with larger area, which will improve the routing flexibility.

Figure 2A:
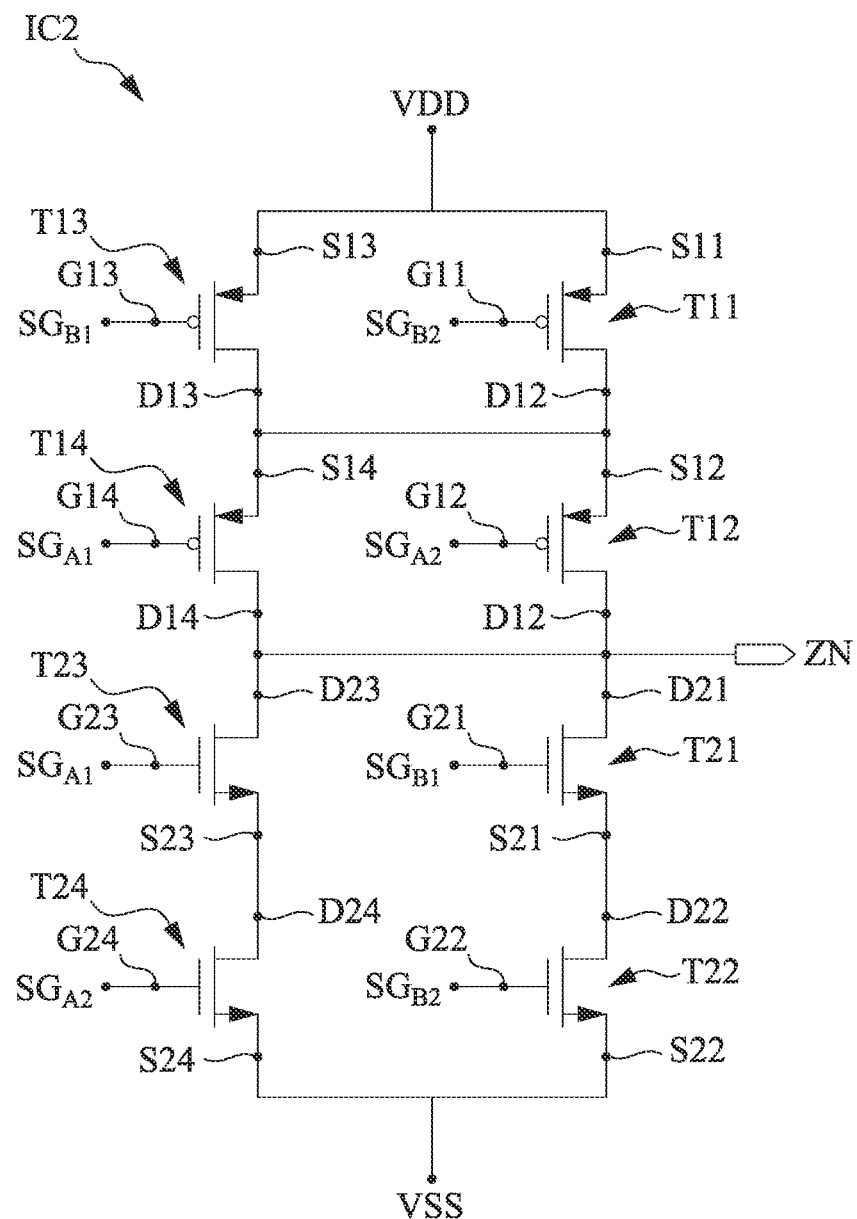
FIG. 2A is an integrated circuit in accordance with some embodiments of the present disclosure.
Figure 2B:
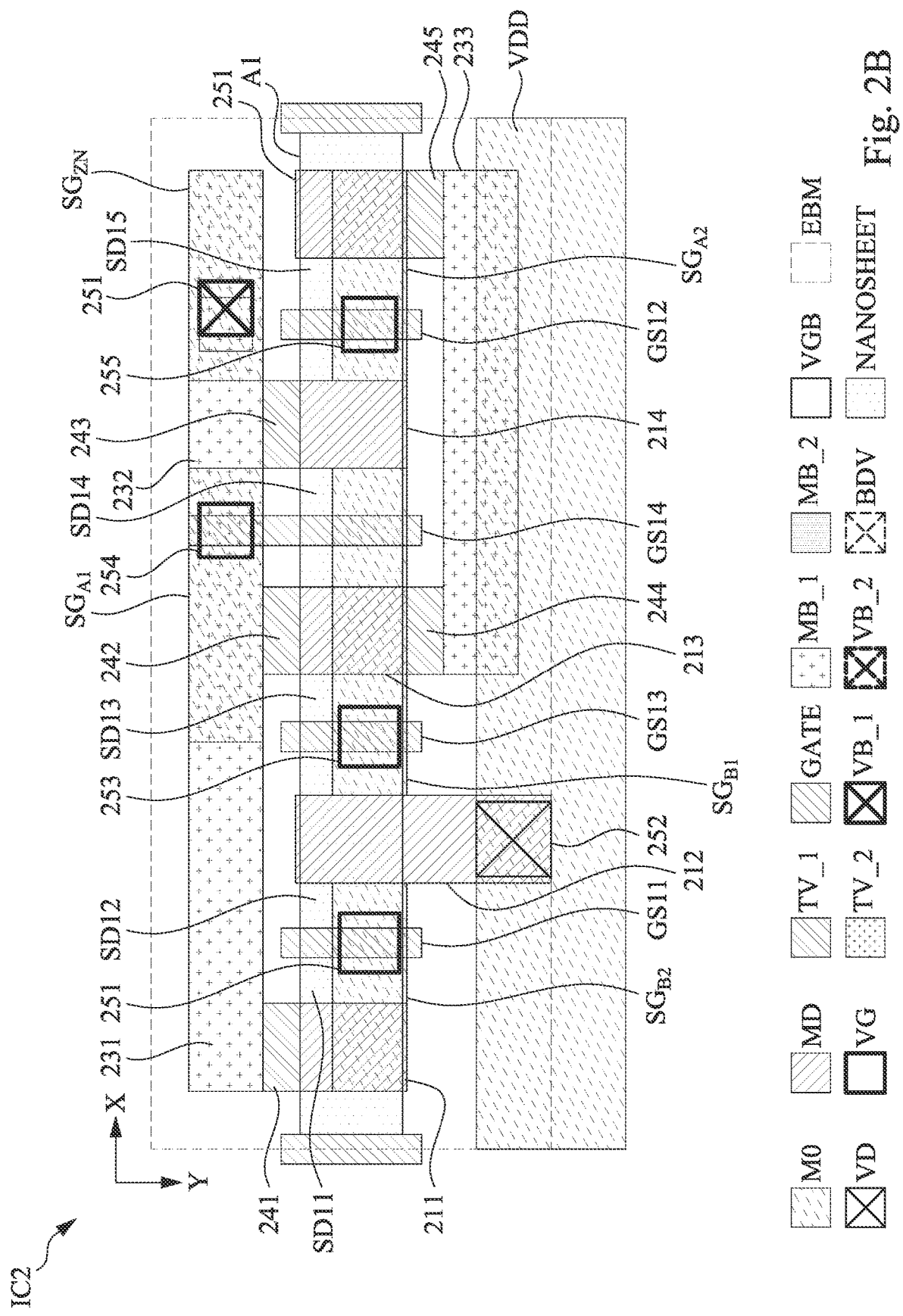
Figure 2C:
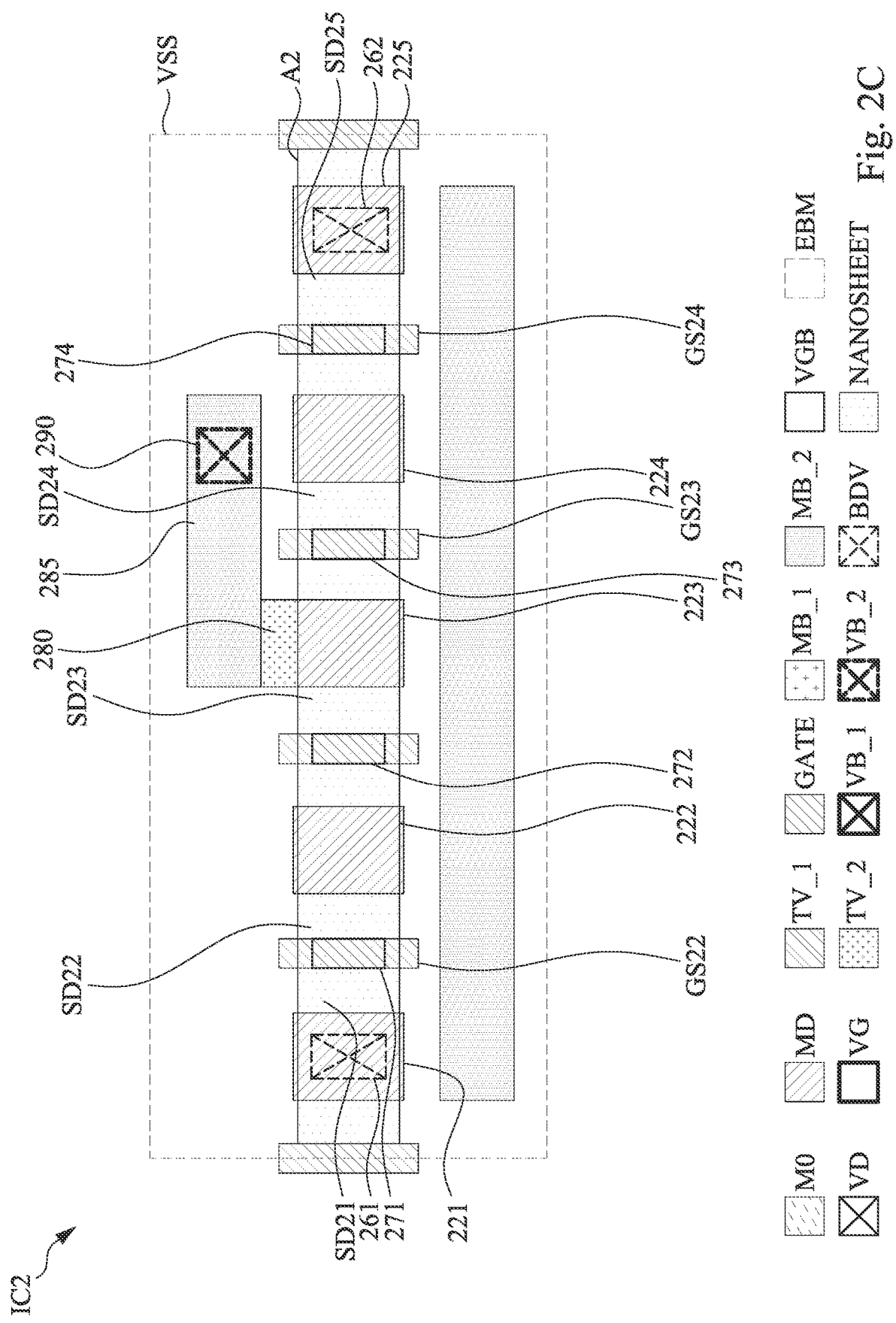

FIG. 2A is an integrated circuit in accordance with some embodiments of the present disclosure. FIGS. 2B-2D are plane views of an integrated circuit in accordance with some embodiments of the present disclosure.

Reference is made to FIG. 2A. Shown there is an integrated circuit IC2. The integrated circuit IC2 includes transistors T11, T12, T13, T14, T21, T22, T23, and T24. In some embodiments, the transistors T11, T12, T13, T14, T21, T22, T23, and T24 are Metal-Oxide-Semiconductor Field-Effect Transistor (MOSFET). In some embodiments, the transistors T11, T12, T13, and T14 have the same conductivity type, and the transistors T21, T22, T23, and T24 have the same conductivity type, respectively. In some embodiments, the transistors T11, T12, T13, and T14 have a first conductivity type (e.g., p-type), while the transistors T21, T22, T23, and T24 have a second conductivity type (e.g., n-type) different from the first conductivity type. As an example of FIG. 2A, the transistors T11, T12, T13, and T14 may be p-type transistors, such as a PMOS. On the other hand, the transistors T21, T22, T23, and T24 may be n-type transistors, such as an NMOS. However, in some other embodiments, the transistors T11, T12, T13, and T14 can be n-type transistors, such as an NMOS, and the transistors T21, T22, T23, and T24 can be p-type transistors, such as a PMOS.

The transistor T11 includes a gate G11, a source S11, and a drain D11. The transistor T12 includes a gate G12, a source S12, and a drain D12. The transistor T13 includes a gate G13, a source S13, and a drain D13. The transistor T14 includes a gate G14, a source S14, and a drain D14. The transistor T21 includes a gate G21, a source S21, and a drain D21. The transistor T22 includes a gate G22, a source S22, and a drain D22. The transistor T23 includes a gate G23, a source S23, and a drain D23. The transistor T24 includes a gate G24, a source S24, and a drain D24.

The source S11 of the transistor T11 and the source S12 of the transistor T13 are electrically coupled to each other, and are electrically coupled to a power line VDD. The source S22 of the transistor T22 and the source S24 of the transistor T24 are electrically coupled to each other, and are electrically coupled to a power line VSS. In some embodiments, when in operation of the integrated circuit IC2, a high level voltage is applied to the power line VDD, and a low level voltage is applied to the power line VSS.

The gate S11 and of the transistor T11 is electrically coupled to a signal line $SG_{B2}$, and the gate S22 and of the transistor T22 is electrically coupled to a signal line $SG_{B2}$. That is, the gate S11 and of the transistor T11 is electrically coupled to the gate S22 and of the transistor T22.

The gate S12 and of the transistor T12 is electrically coupled to a signal line $SG_{A2}$, and the gate S24 and of the transistor T24 is electrically coupled to a signal line $SG_{A2}$. That is, the gate S12 and of the transistor T12 is electrically coupled to the gate S24 and of the transistor T24.

The gate S13 and of the transistor T13 is electrically coupled to a signal line $SG_{B1}$, and the gate S21 and of the transistor T21 is electrically coupled to a signal line $SG_{B1}$. That is, the gate S13 and of the transistor T13 is electrically coupled to the gate S21 and of the transistor T21.

The gate S14 and of the transistor T14 is electrically coupled to a signal line $SG_{A1}$, and the gate S21 and of the transistor T21 is electrically coupled to a signal line $SG_{A1}$. That is, the gate S14 and of the transistor T14 is electrically coupled to the gate S21 and of the transistor T21.

The drain D11 of the transistor T11, the source S12 of the transistor T12, the drain D12 of the transistor T12, and the source S14 of the transistor T14 are electrically coupled to each other. The drain D22 of the transistor T22 and source S21 of the transistor T21 are electrically coupled to each other. The drain D24 of the transistor T24 and the source S23 of the transistor T23 are electrically coupled to each other. The drain D12 of the transistor T12, the drain D21 of the transistor T21, the drain D14 of the transistor T14, and the drain D23 of the transistor T23 are electrically coupled to each other, and are electrically coupled to a signal line $SG_{ZN}$.

Reference is made to FIGS. 2B to 2D, in which FIGS. 2B to 2D are plane view of the integrated circuit IC2 of FIG. 2A. FIGS. 2B to 2D are similar to FIGS. 1D to 1F, in that FIG. 2B is a plane view which illustrates an upper part of the integrated circuit IC2 of FIG. 2A, and FIG. 2C is a plane view which illustrates a lower part of the integrated circuit IC2 of FIG. 2A. FIG. 2D is a plane view of the whole integrated circuit IC2 of FIG. 2A. For example, FIG. 2D is a plane view including the plane view of FIG. 2B stacking over the plane view of FIG. 2C. It is noted that some elements of FIGS. 2B to 2D are similar to those described in FIGS. 1B to 1F, and thus relevant structural details will not be repeated for brevity.

The integrated circuit IC2 includes an active region A1 (see FIG. 2B) and an active region A2 (see FIG. 2C) extending along the X direction. With respect to the active region A1 of FIG. 2B, the integrated circuit IC2 further includes gate structures GS11, GS12, GS13, and GS14 wrapping around four sides of the active region A1. That is, the gate structures GS11, GS12, GS13, and GS14 are in contact with at least four sides of the active region A1, respectively. In some embodiments, the active region A1 includes source/drain regions SD11, SD12, SD13, SD14, and SD15, in which the source/drain regions SD11 and SD12 are on opposite sides of the gate structure GS11, the source/drain regions SD12 and SD13 are on opposite sides of the gate structure GS13, source/drain regions SD13 and SD14 are on opposite sides of the gate structure GS14, and source/drain regions SD14 and SD15 are on opposite sides of the gate structure GS12. In some embodiments, the source/drain region SD12 is between the gate structures GS11 and GS13, the source/drain region SD13 is between the gate structures GS13 and GS14, and the source/drain region SD14 is between the gate structures GS14 and GS12. That is, the gate structures GS11 and GS13 share the same source/drain region SD12, the gate structures GS13 and GS14 share the same source/drain region SD13, and the gate structures GS14 and GS12 share the same source/drain region SD14.

Referring to FIGS. 2A and 2B. The gate structure GS11 and the source/drain regions SD11 and SD12 form the transistor T11 of FIG. 2A, in which the gate structure GS11 corresponds to the gate G11 of FIG. 2A, the source/drain region SD11 corresponds to the drain D11 of FIG. 2A, and the source/drain region SD12 corresponds to the source S11 of FIG. 2A. The gate structure GS13 and the source/drain regions SD12 and SD13 form the transistor T13 of FIG. 2A, in which the gate structure GS13 corresponds to the gate G13 of FIG. 2A, the source/drain region SD12 corresponds to the source S13 of FIG. 2A, and the source/drain region SD13 corresponds to the drain D13 of FIG. 2A. The gate structure GS14 and the source/drain regions SD13 and SD14 form the transistor T14 of FIG. 2A, in which the gate structure GS14 corresponds to the gate G14 of FIG. 2A, the source/drain region SD13 corresponds to the source S14 of FIG. 2A, and the source/drain region SD14 corresponds to the drain D14 of FIG. 2A. The gate structure GS12 and the source/drain regions SD14 and SD15 form the transistor T12 of FIG. 2A, in which the gate structure GS12 corresponds to the gate G12 of FIG. 2A, the source/drain region SD14 corresponds to the drain D12 of FIG. 2A, and the source/drain region SD15 corresponds to the source S14 of FIG. 2A. Accordingly, the source/drain regions SD12 of FIG. 2B can act as the source S11 of transistor T1 and the source S13 of transistor T13 of FIG. 2A. The source/drain regions SD13 of FIG. 2B can act as the drain D13 of transistor T13 and the source S14 of transistor T14 of FIG. 2A. The source/drain regions SD14 of FIG. 2B can act as the drain D14 of transistor T14 and the drain D12 of transistor T12 of FIG. 2A.

With respect to the active region A2 of FIG. 2C, the integrated circuit IC2 further includes gate structures GS21, GS22, GS23, and GS24 wrapping around four sides of the active region A2. That is, the gate structures GS21, GS22, GS23, and GS24 are in contact with at least four sides of the active region A2, respectively. In some embodiments, the active region A2 includes source/drain regions SD21, SD22, SD23, SD24, and SD25, in which the source/drain regions SD21 and SD22 are on opposite sides of the gate structure GS22, the source/drain regions SD22 and SD23 are on opposite sides of the gate structure GS21, source/drain regions SD23 and SD24 are on opposite sides of the gate structure GS23, and source/drain regions SD24 and SD25 are on opposite sides of the gate structure GS24. In some embodiments, the source/drain region SD22 is between the gate structures GS22 and GS21, the source/drain region SD23 is between the gate structures GS21 and GS23, and the source/drain region SD24 is between the gate structures GS23 and GS24. That is, the gate structures GS22 and GS21 share the same source/drain region SD22, the gate structures GS21 and GS23 share the same source/drain region SD23, and the gate structures GS23 and GS24 share the same source/drain region SD24.

Referring to FIGS. 2A and 2C. The gate structure GS22 and the source/drain regions SD21 and SD22 form the transistor T22 of FIG. 2A, in which the gate structure GS22 corresponds to the gate G22 of FIG. 2A, the source/drain region SD21 corresponds to the source S22 of FIG. 2A, and the source/drain region SD22 corresponds to the drain D22 of FIG. 2A. The gate structure GS21 and the source/drain regions SD22 and SD23 form the transistor T21 of FIG. 2A, in which the gate structure GS21 corresponds to the gate G21 of FIG. 2A, the source/drain region SD22 corresponds to the source S21 of FIG. 2A, and the source/drain region SD23 corresponds to the drain D21 of FIG. 2A. The gate structure GS23 and the source/drain regions SD23 and SD24 form the transistor T23 of FIG. 2A, in which the gate structure GS23 corresponds to the gate G23 of FIG. 2A, the source/drain region SD23 corresponds to the drain D23 of FIG. 2A, and the source/drain region SD24 corresponds to the source S23 of FIG. 2A. The gate structure GS24 and the source/drain regions SD24 and SD25 form the transistor T24 of FIG. 2A, in which the gate structure GS24 corresponds to the gate G24 of FIG. 2A, the source/drain region SD24 corresponds to the drain D24 of FIG. 2A, and the source/drain region SD25 corresponds to the source S24 of FIG. 2A. Accordingly, the source/drain regions SD22 of FIG. 2C can act as the drain D22 of transistor T22 and the source S21 of transistor T21 of FIG. 2A. The source/drain regions SD23 of FIG. 2C can act as the drain D21 of transistor T21 and the drain D23 of transistor T23 of FIG. 2A. The source/drain regions SD24 of FIG. 2C can act as the source S23 of transistor T23 and the drain D24 of transistor T24 of FIG. 2A.

It is noted that, similar to those described in FIGS. 1A to 1F, the structure discussed in FIGS. 2A to 2D can be referred to as a gate-all-around (GAA) structure. In some embodiments, the active regions A1 and A2 may be referred to as "nanosheets" or "nanowires" used to form a channel region of the GAA device discussed herein. In some embodiments, the active region A1 and the active region A2 are identified in the legend in the drawings (FIGS. 2C to 2D) with label "NANOSHEET." In some embodiments, the gate structures GS11-14 and GS21-24 are identified in the legend in the drawings (FIGS. 2C to 2D) with label "GATE."

The integrated circuit IC2 further includes source/drain contacts 211, 212, 213, 214, and 215 (see FIG. 2B). The source/drain contacts 211, 212, 213, 214, and 215 wrap around four sides of the source/drain regions SD11, SD12, SD13, SD14, and SD15, respectively. The integrated circuit IC2 further includes source/drain contacts 221, 222, 223, 224, and 225 (see FIG. 2C). The source/drain contacts 221, 222, 223, 224, and 225 wrap around four sides of the source/drain regions SD21, SD22, SD23, SD24, and SD25, respectively.

With respect to FIG. 2B, the integrated circuit IC2 further includes metal lines 231, 232, and 233. In some embodiments, the metal lines 231, 232, and 233 are adjacent to the active region A1. The integrated circuit IC2 further includes vias 241, 242, 243, 244, and 245. In some embodiments, the via 241 is in contact with the sidewall of the source/drain contact 211 and the sidewall of the metal line 231, and the via 242 is in contact with the sidewall of the source/drain contact 213 and the sidewall of the metal line 231. Accordingly, the source/drain region SDI 1 of the active region A1 is electrically coupled to the source/drain region SD13 of the active region A1 through the via 241, the metal line 231, and the via 242. The via 243 is in contact with the sidewall of the source/drain contact 214 and the sidewall of the metal line 232. In some embodiments, the via 244 is in contact with the sidewall of the source/drain contact 213 and the sidewall of the metal line 233, and the via 245 is in contact with the sidewall of the source/drain contact 215 and the sidewall of the metal line 233. Accordingly, the source/drain region SD13 of the active region A1 is electrically coupled to the source/drain region SD15 of the active region A1 through the via 244, the metal line 233, and the via 245. In some embodiments, the metal lines 231, 232, and 233 are identified in the legend in the drawings (FIGS. 2C to 2D) with label "MB_1." In some embodiments, the vias 241, 242, 243, 244, and 245 are identified in the legend in the drawings (FIGS. 2C to 2D) with label "TV_1."

The integrated circuit IC2 further includes power line VDD and a via 252. The power line VDD extend along the X direction, and is above the active region A1 and the gate structures GS11-14. The via 252 is above and in contact with the top surface of the source/drain contact 212, and is below and in contact with the bottom surface of the power line VDD. Accordingly, the source/drain region SD12 is electrically coupled to the power line VDD through the source/drain contact 212 and, the via 252. In some embodiments, the power line VDD is identified in the legend in the drawings (FIGS. 2C to 2D) with label "M0." In some embodiments, the via 252 is identified in the legend in the drawings (FIGS. 2C to 2D) with label "VD."

The integrated circuit IC2 includes signal lines $SG_{A1}$, $SG_{A2}$, $SG_{B1}$, $SG_{B2}$, and $SG_{ZN}$. The integrated circuit IC2 includes vias 251, 253, 254, 255, and 256. The signal lines $SG_{A1}$, $SG_{A2}$, $SG_{B1}$, $SG_{B2}$, and $SG_{ZN}$ extend along the X direction, and are above the active region A1 and the gate structures GS11-14. The via 251 is above and in contact with the top surface of the gate structure GS11, and is below and in contact with the bottom surface of the signal line $SG_{B2}$. Accordingly, the gate structure GS11 is electrically coupled to the signal line $SG_{B2}$ through the via 251. The via 253 is above and in contact with the top surface of the gate structure GS13, and is below and in contact with the bottom surface of the signal line $SG_{B1}$. Accordingly, the gate structure GS13 is electrically coupled to the signal line $SG_{B1}$ through the via 253. The via 254 is above and in contact with the top surface of the gate structure GS14, and is below and in contact with the bottom surface of the signal line $SG_{A1}$. Accordingly, the gate structure GS14 is electrically coupled to the signal line $SG_{A1}$ through the via 254. The via 255 is above and in contact with the top surface of the gate structure GS12, and is below and in contact with the bottom surface of the signal line $SG_{A2}$. Accordingly, the gate structure GS12 is electrically coupled to the signal line $SG_{A2}$ through the via 255. The via 256 is above and in contact with the top surface of the metal line 232, and is below and in contact with the bottom surface of the signal line $SG_{ZN}$. Accordingly, the source/drain region SD14 is electrically coupled to the signal line $SG_{ZN}$ through the source/drain contact 214, the via 243, the metal line 232, and the via 256. In some embodiments, the signal lines $SG_{A1}$, $SG_{A2}$, $SG_{B1}$, $SG_{B2}$, and $SG_{ZN}$ are identified in the legend in the drawings (FIGS. 2C to 2D) with label "M0." In some embodiments, the vias 251, 253, and 255 are identified in the legend in the drawings (FIGS. 2C to 2D) with label "VG." In some embodiments, the via 256 is identified in the legend in the drawings (FIGS. 2C to 2D) with label "VB_1."

With respect to FIG. 2C, the integrated circuit IC2 includes via 261 and 262, and a power line VSS. The power line VSS is below the active region A2 and the gate structures GS21-24. The via 261 is above and in contact with the top surface of the power line VSS, and is below and in contact with the bottom surface of the source/drain contact 221. Accordingly, the source/drain region SD21 is electrically coupled to the power line VSS through the source/drain contact 221 and the via 261. On the other hand, the via 262 is above and in contact with the top surface of the power line VSS, and is below and in contact with the bottom surface of the source/drain contact 225. Accordingly, the source/drain region SD25 is electrically coupled to the power line VSS through the source/drain contact 225 and the via 262. In some embodiments, the power line VSS is identified in the legend in the drawings (FIGS. 2C to 2D) with label "EBM." In some embodiments, the vias 261 and 262 are identified in the legend in the drawings (FIGS. 2C to 2D) with label "BDV."

The integrated circuit IC2 includes vias 271, 272, 273, and 274. The vias 271, 272, 273, and 274 are above and in contact with top surfaces of gate structures GS22, GS21, GS23, and GS24, respectively. On the other hand, as illustrated in FIGS. 2B, 2C, and 2D, the vias 271, 272, 273, and 274 are below and in contact with bottom surfaces of gate structures GS11, GS13, GS14, and GS12, respectively. That is, the gate structures GS22, GS21, GS23, and GS24 are electrically coupled respectively to the gate structures GS11, GS13, GS14, and GS12 through the respective vias 271, 272, 273, and 274. As the gate structures GS11, GS13, GS14, and GS12 are electrically coupled to the signal lines $SG_{B2}$, $SG_{B1}$, $SG_{A1}$, and $SG_{A2}$, respectively, the gate structures GS22, GS21, GS23, and GS24 are therefore electrically coupled to the signal lines $SG_{B2}$, $SG_{B1}$, $SG_{A1}$, and $SG_{A2}$, respectively. In some embodiments, the vias 271, 272, 273, and 274 are identified in the legend in the drawings (FIGS. 2C to 2D) with label "VG."

The integrated circuit IC2 includes a via 280, a metal line 285, and a via 290. The metal line 285 is adjacent to the active region A2 and the source/drain contact 223. The via 280 is in contact with the sidewall of the source/drain contact 223 and the sidewall of the metal line 285. The via 290 is above and in contact with the top surface of the metal line 285. As illustrated in FIGS. 2B, 2C, and 2D, the via 290 is below and in contact with the bottom surface of the metal line 232. As the metal line is electrically coupled to the signal line $SG_{ZN}$, the source/drain region SD23 is therefore electrically coupled to the signal line $SG_{ZN}$. In some embodiments, the via 280 is identified in the legend in the drawings (FIGS. 2C to 2D) with label "TV_2." In some embodiments, the metal line 285 is identified in the legend in the drawings (FIGS. 2C to 2D) with label "MB_2." In some embodiments, the via 290 is identified in the legend in the drawings (FIGS. 2C to 2D) with label "VB_2."

Figure 3:
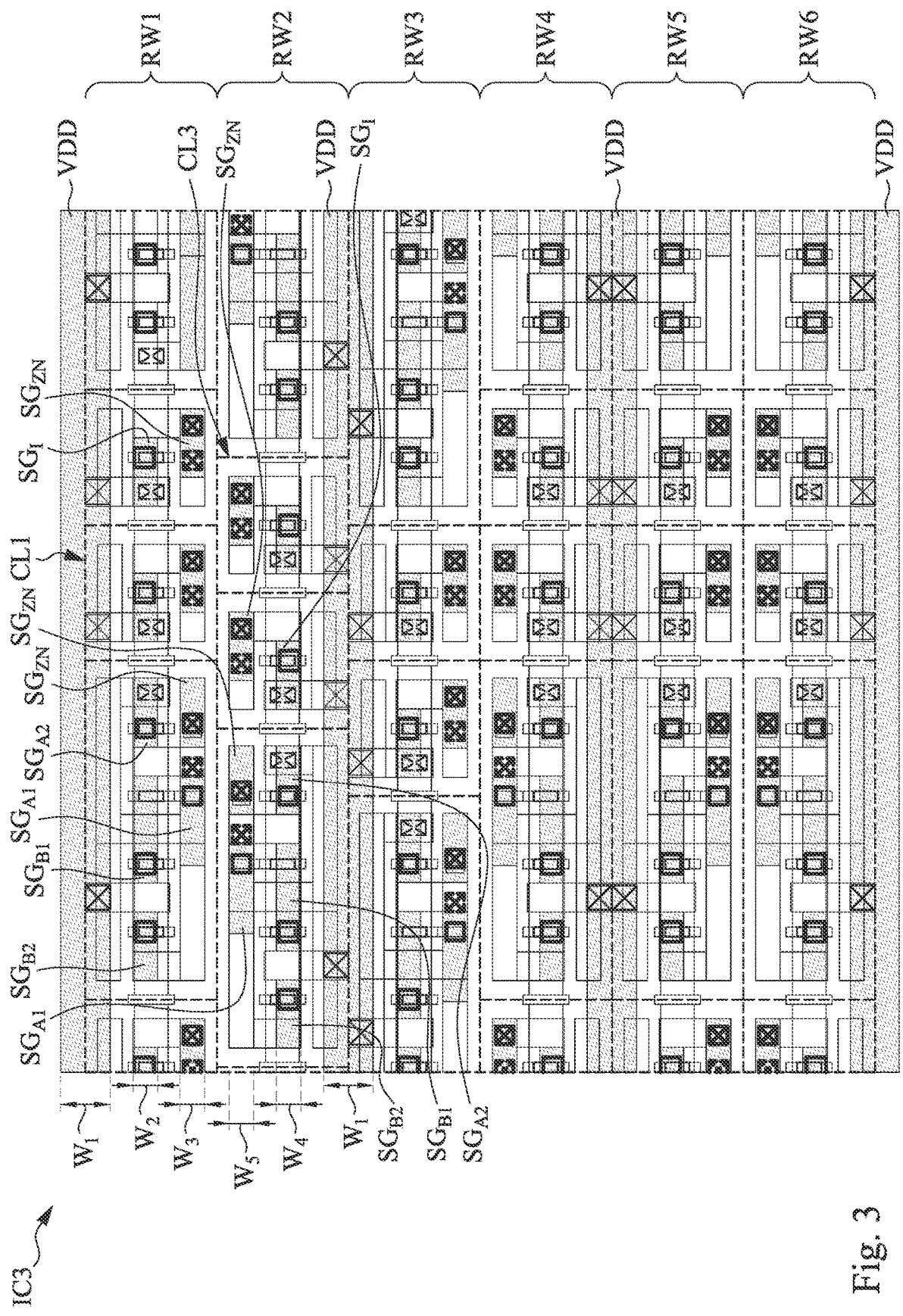
FIG. 3 is a plane view of an integrated circuit in accordance with some embodiments of the present disclosure.

FIG. 3 is a plane view of an integrated circuit in accordance with some embodiments of the present disclosure.

Shown there is an integrated circuit IC3. The integrated circuit IC3 includes a plurality of rows RW1, RW2, RW3, RW4, RW5, and RW6, in which each row of the integrated circuit IC3 includes a plurality of cells arranged along the X direction. For example, with respect to row RW1 of the integrated circuit IC3, the integrated circuit IC3 includes at least a cell CLI and a cell CL2. In some embodiments, the cell CLI is similar or the same as the integrated circuit IC1 discussed above with respect to FIGS. 1A to 1F, and the cell CL2 is similar or the same as the integrated circuit IC1 discussed above with respect to FIGS. 2A to 2D.

As mentioned above, the cell CL1 (e.g., the integrated circuit IC1 of FIGS. 1A to 1F) includes a power line VDD, a signal line $SG_I$, and a signal line $SG_{ZN}$. On the other hand, the cell CL2 (e.g., the integrated circuit IC2 of FIGS. 2A to 2D) includes a power line VDD, a signal line $SG_{A1}$, a signal line $SG_{A2}$, a signal line $SG_{B1}$, a signal line $SG_{B2}$, and a signal line $SG_{ZN}$. In some embodiments, the power line VDD of the cell CL1 and the power line VDD of the cell CL2 are the same. Stated another way, the cell CL1 and the cell CL2 share the same power line VDD. More particularly, the cells in row RW1 of the integrated circuit IC3 share the same power line VDD.

On the other hand, with respect to row RW2 of the integrated circuit IC3, the integrated circuit IC3 includes at least a cell CL3 and a cell CL4. In some embodiments, the cell CL3 is similar or the same as the integrated circuit IC1 discussed above with respect to FIGS. 1A to 1F, and the cell CL4 is similar or the same as the integrated circuit IC1 discussed above with respect to FIGS. 2A to 2D.

As mentioned above, the cell CL3 (e.g., the integrated circuit IC1 of FIGS. 1A to 1F) includes a power line VDD, a signal line $SG_I$, and a signal line $SG_{ZN}$. On the other hand, the cell CL4 (e.g., the integrated circuit IC2 of FIGS. 2A to 2D) includes a power line VDD, a signal line $SG_{A1}$, a signal line $SG_{A2}$, a signal line $SG_{B1}$, a signal line $SG_{B2}$, and a signal line $SG_{ZN}$. In some embodiments, the power line VDD of the cell CL3 and the power line VDD of the cell CL4 are the same. Stated another way, the cell CL3 and the cell CL4 share the same power line VDD. More particularly, the cells in row RW2 of the integrated circuit IC3 share the same power line VDD.

In some embodiments, power lines VDD, a signal lines $SG_I$, and a signal lines $SG_{ZN}$ of cells CL1 and CL3, the power lines VDD, a signal lines $SG_{A1}$, a signal lines $SG_{A2}$, a signal lines $SG_{B1}$, a signal lines $SG_{B2}$, and a signal lines $SG_{ZN}$ of cell CL2 and CL4, as well as power lines and signal lines of other cells of the integrated circuit IC3 are present at the same layer, such as a metal-0 (M0) layer.

In some embodiments, each of the power lines VDD has a width WI. With respect to row RW1 of the integrated circuit IC3, the signal line $SG_I$ of cell CL1, and the signal line $SG_{A2}$, the signal line $SG_{B1}$, the signal line $SG_{B2}$ of cell CL2 are substantially at the same track and have a width W2. On the other hand, the signal line $SG_{ZN}$ of cell CL1, and the signal line $SG_{A1}$, the signal line $SG_{ZN}$ of cell CL2 are substantially at the same track and have a width W3. Similarly, with respect to row RW2 of the integrated circuit IC3, the signal line $SG_I$ of cell CL3, and the signal line $SG_{A2}$, the signal line $SG_{B1}$, the signal line $SG_{B2}$ of cell CL4 are substantially at the same track and have a width W4. On the other hand, the signal line $SG_{ZN}$ of cell CL3, and the signal line $SG_{A1}$, the signal line $SG_{ZN}$ of cell CL4 are substantially at the same track and have a width W5. In some embodiments, the widths W2, W3, W4, and W5 are substantially the same, and are the critical dimension (CD) in a technology node (e.g., 10 nm node, 7 nm node, 5 nm node, 3 nm node or beyond). Here, the term "critical dimension" is a smallest (or minimum) dimension of a pattern feature, such as the widths W2, W3, W4, and W5. In some embodiments, the width W1 of the power lines VDD is greater than the widths W2, W3, W4, and W5 of the signal lines. That is, the width W1 of the power lines VDD is greater than critical dimension. Here, the term "width" is defined as the length of the power lines or signal lines along the Y direction.

As shown in FIG. 3, four tracks of signal lines are present between two power lines VDD along the Y direction. It is noted that, the power lines VSS of the cells (e.g., cells CL1-CL4) of integrated circuit IC3 do not present at the same layer as the power lines VDD and the signal lines. This is because, as discussed above with respect to FIGS. 1A to 1F and 2A to 2D, the power lines VSS are disposed below the power lines VDD and the signal lines.

Figure 4:
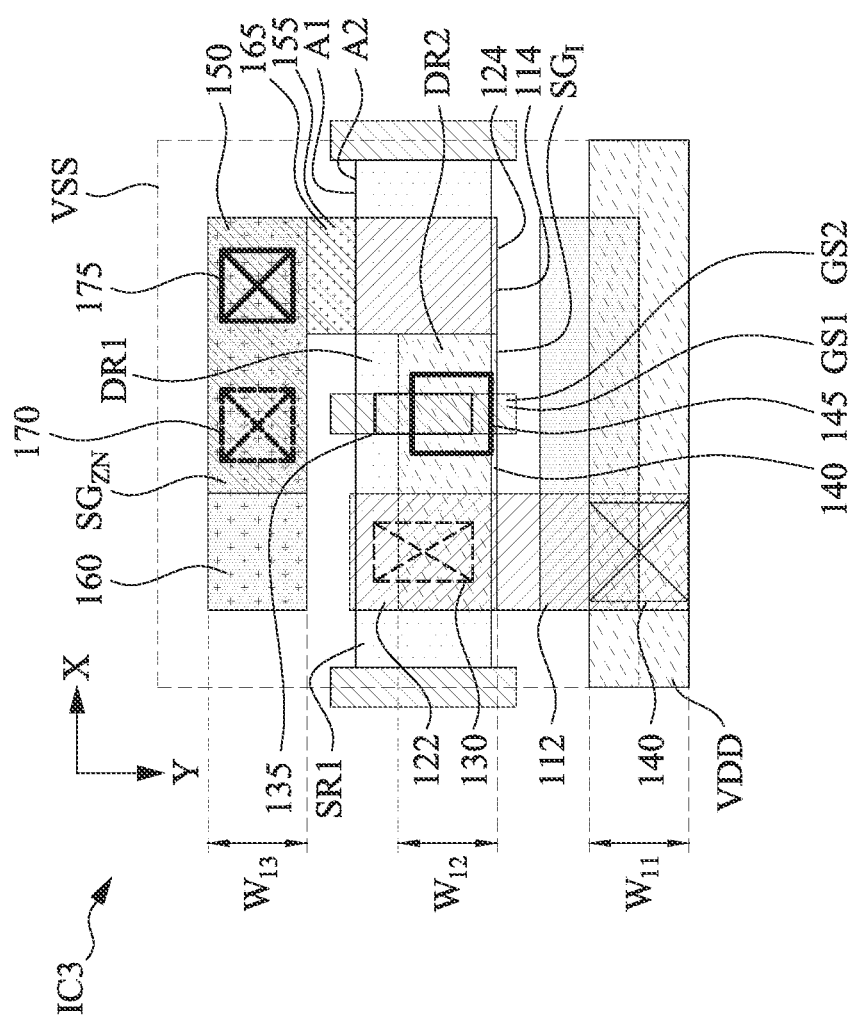
FIG. 4 is a plane view of an integrated circuit in accordance with some embodiments of the present disclosure.

FIG. 4 is a plane view of an integrated circuit in accordance with some embodiments of the present disclosure.

Shown there is an integrated circuit IC4, the integrated circuit IC4 is similar to the integrated circuit IC1 discussed above with respect to FIGS. 1A to 1F, and thus relevant details will not be repeated for simplicity. The integrated circuit IC4 includes a power line VDD, a signal line $SG_I$, and a signal line $SG_{ZN}$. Different from those discussed above with respect to FIG. 3, the width W11 of the power line VDD is substantially the same as the width W12 of the signal line $SG_I$ and the width W13 of the signal line $SG_{ZN}$. In some embodiments, the widths W11, W12, and W13 are the critical dimension (CD) in a technology node. By forming the power line VDD having the critical dimension, the density of the final product may be increased.

FIGS. 5-12 illustrate a method in various stages of fabricating an integrated circuit in accordance with some embodiments of the present disclosure.

Figure 5:
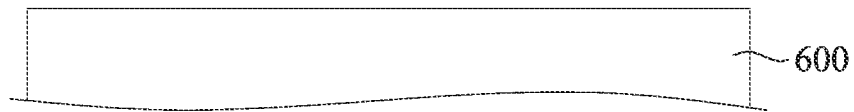
FIGS. 5-12 illustrate a method in various stages of fabricating an integrated circuit in accordance with some embodiments of the present disclosure.

Reference is made to FIG. 5. Shown there is a semiconductor substrate 600. In some embodiments, the substrate 600 includes silicon. Alternatively, the substrate 600 may include germanium, silicon germanium, gallium arsenide or other appropriate semiconductor materials. Also alternatively, the substrate 600 may include an epitaxial layer. For example, the substrate 600 may have an epitaxial layer overlying a bulk semiconductor. Further, the substrate 600 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrate may be formed by selective epitaxial growth (SEG). Furthermore, the substrate 600 may include a semiconductor-on-insulator (SOI) structure. Also alternatively, the substrate 600 may include a buried dielectric layer, such as a buried oxide (BOX) layer, such as that formed by separation by implantation of oxygen (SIMOX) technology, wafer bonding, SEG, or other appropriate method.

Figure 6:
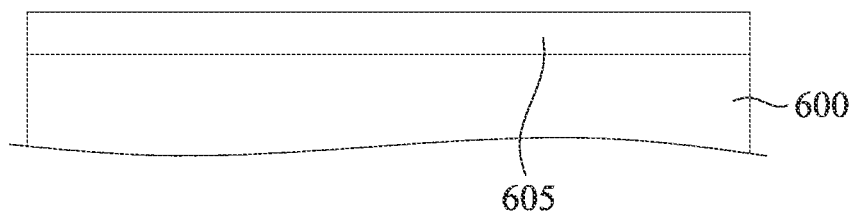

Reference is made to FIG. 6. A dielectric layer 605 is deposited over the substrate 600. In some embodiments, the dielectric layer 605 may include $SiO_2$, $Si_3N_4$, $SiO_xN_y$, fluorine-doped silicate glass (FSG), a low-k dielectric, combinations thereof, and/or other suitable materials. The dielectric layer 605 may be formed by suitable process, such as chemical vapor deposition (CVD), physical vapor deposition (PVD), atomic layer deposition (ALD), or any suitable process.

Figure 7:
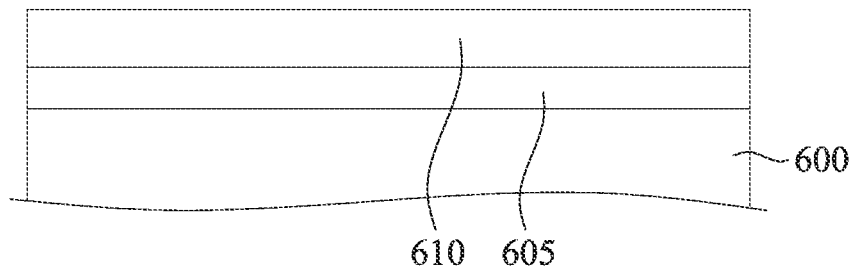

Reference is made to FIG. 7. A metal layer 610 is deposited over the dielectric layer 605. In some embodiments, the metal layer 610 may include copper (Cu), aluminum (Al), or suitable conductive material. The metal layer 610 may be formed by suitable process, such as chemical vapor deposition (CVD), physical vapor deposition (PVD), atomic layer deposition (ALD), or any suitable process.

Figure 8:
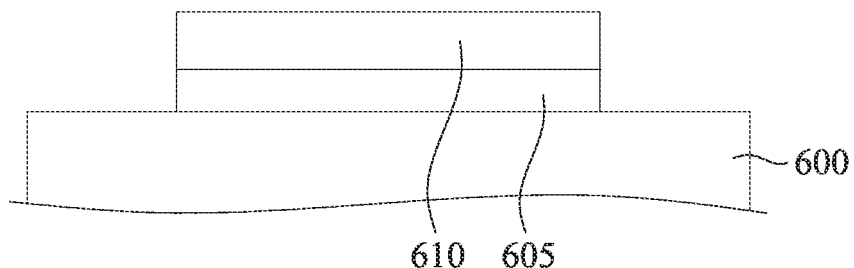

Reference is made to FIG. 8. The metal layer 610 and the dielectric layer 605 are patterned. In some embodiments, a patterned mask is formed over the metal layer 610, in which the patterned mask includes openings that exposed portions of the metal layer 610. Then, an etching process is performed to remove the exposed portions of the metal layer 610 and the underlying dielectric layer 605 by using the patterned mask as an etching mask. After the etching process, the patterned mask is removed. In some embodiments, the patterned mask may be a photoresist layer. In some other embodiments, the patterned mask may be a hard mask layer.

Figure 9:
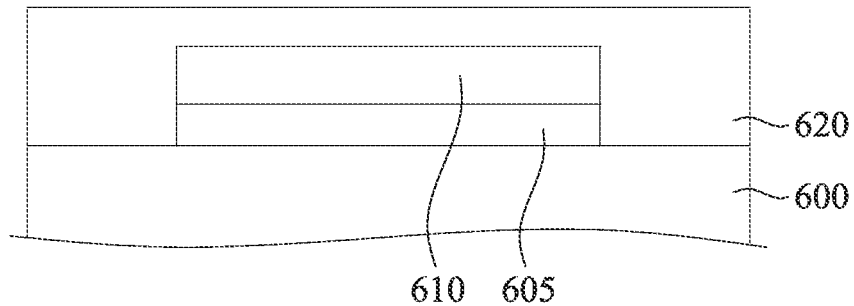

Reference is made to FIG. 9. A dielectric layer 620 is formed over the patterned metal layer 610 and the patterned dielectric layer 605. In some embodiments, the dielectric layer 620 extends from the top surface of the patterned metal layer 610, through the sidewall of the patterned metal layer 610, to the sidewall of the patterned dielectric layer 605. That is, the dielectric layer 620 is in contact with the top surface and sidewalls of the patterned metal layer 610, and sidewalls of the patterned dielectric layer 605. In some embodiments, the dielectric layer 620 may include $SiO_2$, $Si_3N_4$, $SiO_xN_y$, fluorine-doped silicate glass (FSG), a low-k dielectric, combinations thereof, and/or other suitable materials. The dielectric layer 620 may be formed by suitable process, such as chemical vapor deposition (CVD), physical vapor deposition (PVD), atomic layer deposition (ALD), or any suitable process. In some embodiments, the dielectric layer 620 and the dielectric layer 605 may be made of the same material, such as $SiO_2$. In some embodiments, the dielectric layer 620 and the dielectric layer 605 can be collectively referred to as isolation structure, which provides electrical isolation to the metal layer 610. In some embodiments, the isolation structure can also be referred to as shallow trench isolation (STI) structure. In some embodiments, a chemical mechanical polishing (CMP) process may be performed to planarize the top surface of the dielectric layer 620.

Figure 10:
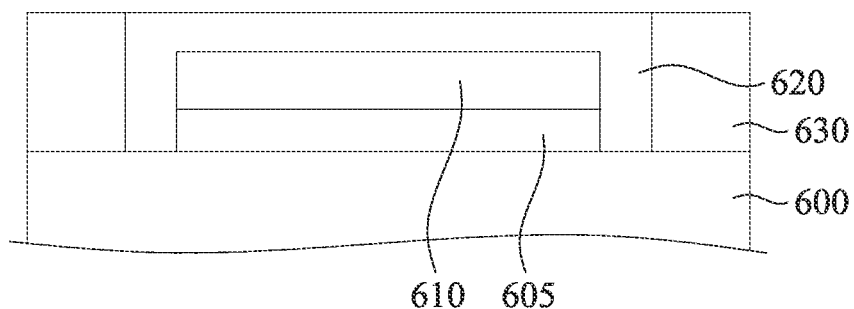

Reference is made to FIG. 10. A dielectric layer 630 is formed in the dielectric layer 620. In some embodiments, the dielectric layer 630 may be formed by, for example, patterning the dielectric layer 620 to form recesses that expose the top surface of the substrate 600, depositing a dielectric material in the recesses and over the dielectric layer 620, and followed by a CMP process to remove excessive dielectric material until the top surface of the dielectric layer 620 is exposed. In some embodiments, the dielectric layer 620 may include $SiO_2$, $Si_3N_4$, $SiO_xN_y$, fluorine-doped silicate glass (FSG), a low-k dielectric, combinations thereof, and/or other suitable materials. The dielectric layer 630 may be formed by suitable process, such as chemical vapor deposition (CVD), physical vapor deposition (PVD), atomic layer deposition (ALD), or any suitable process. In some embodiments, the material of the dielectric layer 630 may be different from the materials of the dielectric layers 605 and 620. For example, in some embodiments, the dielectric layer 630 may be made of silicon nitride, and the dielectric layers 605 and 620 are made of silicon oxide.

Figure 11:
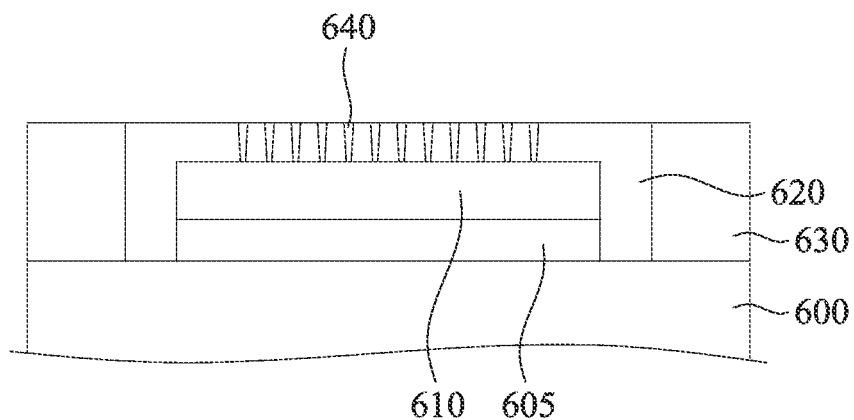

Reference is made to FIG. 11. A plurality of vias 640 are formed in the dielectric layer 620 and in contact with the metal layer 610. In some embodiments, the vias 640 may be formed by, for example, patterning the dielectric layer 620 to form openings that expose the top surface of the metal layer 610, depositing a conductive material in the openings and over the dielectric layer 620, and followed by a CMP process to remove excessive conductive material until the top surface of the dielectric layer 620 is exposed. In some embodiments, the vias 640 may include copper (Cu), aluminum (Al), or suitable conductive material. The vias 640 may be formed by suitable process, such as chemical vapor deposition (CVD), physical vapor deposition (PVD), atomic layer deposition (ALD), or any suitable process.

Figure 12:
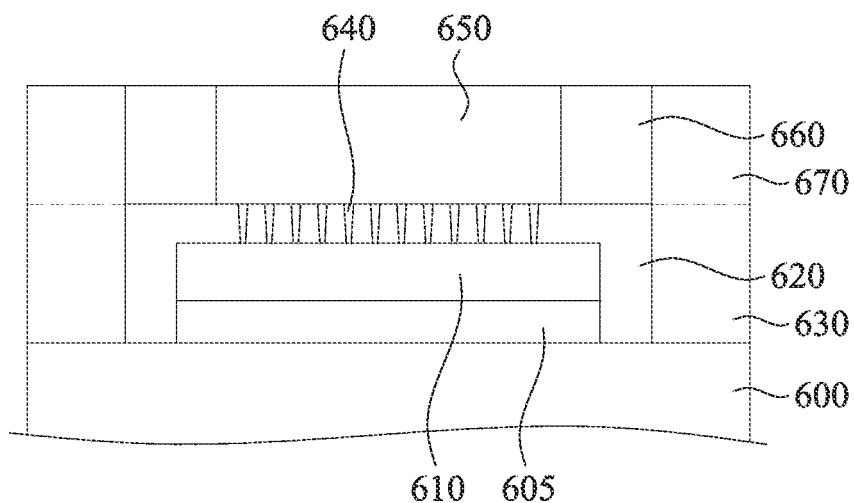

Reference is made to FIG. 12. An integrated circuit 650, an interlayer dielectric (ILD) layer 660, and a dielectric layer 670 are formed over the dielectric layer 620 and the dielectric layer 630. In some embodiments, the integrated circuit 650 may be formed by one or more than one of a front-end-of-line (FEOL), a middle-end-of-line (MEOL), and a back-end-of-line (BEOL) operation. In some embodiments, the FEOL, the MEOL, and the BEOL operations may include deposition processes, etching processes, photolithography processes, epitaxy processes, or suitable processes. In some embodiments, the ILD layer 660 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. In some embodiments, the dielectric layer 670 may include $SiO_2$, $Si_3N_4$, $SiO_xN_y$, fluorine-doped silicate glass (FSG), a low-k dielectric, combinations thereof, and/or other suitable materials. In some embodiments, the material of the dielectric layer 670 may be different from the material of the ILD layer 660. For example, in some embodiments, the dielectric layer 670 may be made of silicon nitride, and the ILD layer 660 may be made of silicon oxide. In some embodiments, the dielectric layer 670 and the dielectric layer 630 may be made of the same material, and the ILD layer 660 and the dielectric layers 605 and 620 may be made of the same material. In some embodiments, the dielectric layer 670 and the dielectric layer 630 may be formed by suitable deposition process, such as CVD, PVD, ALD, or the like.

In some embodiments, the metal layer 610 of FIG. 12 may serve as the power line VSS discussed in FIGS. 1A to 1F, and the vias 640 of FIG. 12 may serve as the via 130 discussed in FIGS. 1A to 1F. On the other hand, the integrated circuit 650 of FIG. 12 may include elements of the integrated circuit IC1 of FIGS. 1A to 1F that are above the via 130 and the power line VSS of FIGS. 1A to 1F. More particularly, the integrated circuit 650 of FIG. 12 may include a second transistor T2 over the substrate 600, a first transistor T1 over the second transistor T2, and a power line VDD over the second transistor T2, as discussed in FIGS. 1A to 1F. Other elements are discussed above with respect to FIGS. 1A to 1F, and thus relevant structural details will not be repeated for brevity. As a result, the integrated circuit 650, the vias 640, and the metal layer 620 form the integrated circuit IC1 discussed in FIGS. 1A to 1F. For example, with respect to FIGS. 1B and 12, the integrated circuit 650 may include transistors T1, T2 of FIG. 1B, and the power line VDD of FIG. 1B above the transistors T1, T2 of FIG. 1B.

In some embodiments, the metal layer 610 of FIG. 12 may serve as the power line VSS discussed in FIGS. 2A to 2D, and the vias 640 of FIG. 12 may serve as the vias 261, 262 discussed in FIGS. 2A to 2D. On the other hand, the integrated circuit 650 of FIG. 12 may include elements of the integrated circuit IC2 of FIGS. 2A to 2D that are above the vias 261, 262 and the power line VSS of FIGS. 2A to 2D. More particularly, the integrated circuit 650 of FIG. 12 may include transistors T21, T22, T23, and T24 over the substrate 600, transistors T1l, T12, T13, T14 over the transistors T21, T22, T23, T24, and a power line VDD over the transistors T11, T12, T13, T14, as discussed in FIGS. 2A to 2D. Other elements are discussed above with respect to FIGS. 2A to 2D, and thus relevant structural details will not be repeated for brevity. As a result, the integrated circuit 650, the vias 640, and the metal layer 620 form the integrated circuit IC2 discussed in FIGS. 2A to 2D.

In some embodiments, the integrated circuit IC1 discussed in FIGS. 1A to 1F and the integrated circuit IC2 discussed in FIGS. 2A to 2D may be formed over the substrate 600 of FIG. 12. In this regard, the metal layer 620 can simultaneously serve as the power line VSS of integrated circuit IC1 of FIGS. 1A to 1F and the power line VSS of integrated circuit IC2 of FIGS. 2A to 2D. That is, the integrated circuit IC1 and the integrated circuit IC2 may share the same power line (e.g., metal layer 610). On the other hand, portions of the vias 640 of FIG. 12 may serve as via 130 of integrated circuit IC1 of FIGS. 1A to 1F, and other portions of the vias 640 of FIG. 12 may serve as the vias 261, 262 of integrated circuit IC2 of FIGS. 2A to 2D. Furthermore, the integrated circuit 650 of FIG. 12 may include elements of the integrated circuit IC1 of FIGS. 1A to 1F that are above the via 130 and the power line VSS of FIGS. 1A to 1F, and may also include elements of the integrated circuit IC2 of FIGS. 2A to 2D that are above the vias 261, 262 and the power line VSS of FIGS. 2A to 2D.

Figure 13A:
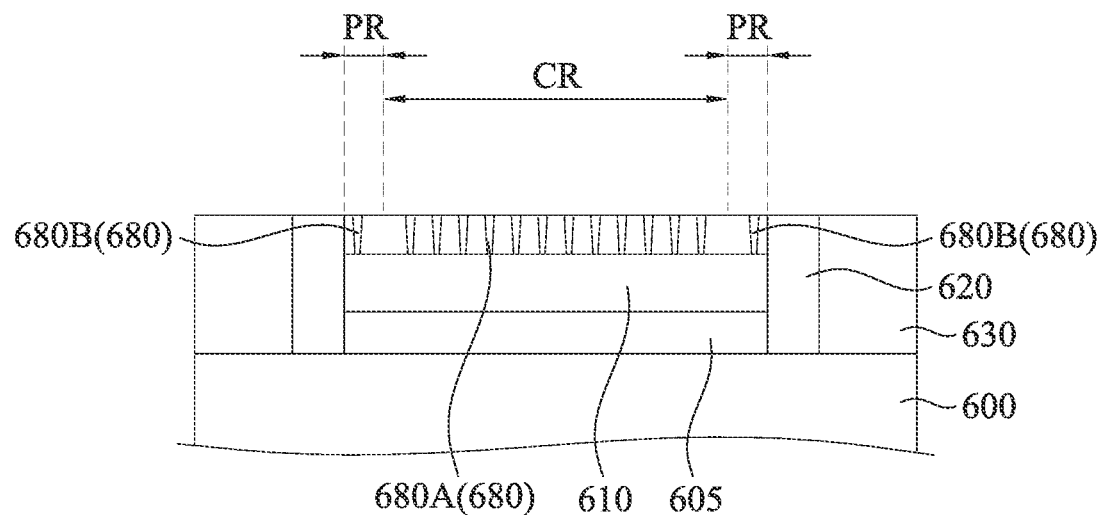
FIGS. 13A-14 illustrate a method in various stages of fabricating an integrated circuit in accordance with some embodiments of the present disclosure.
Figure 13B:
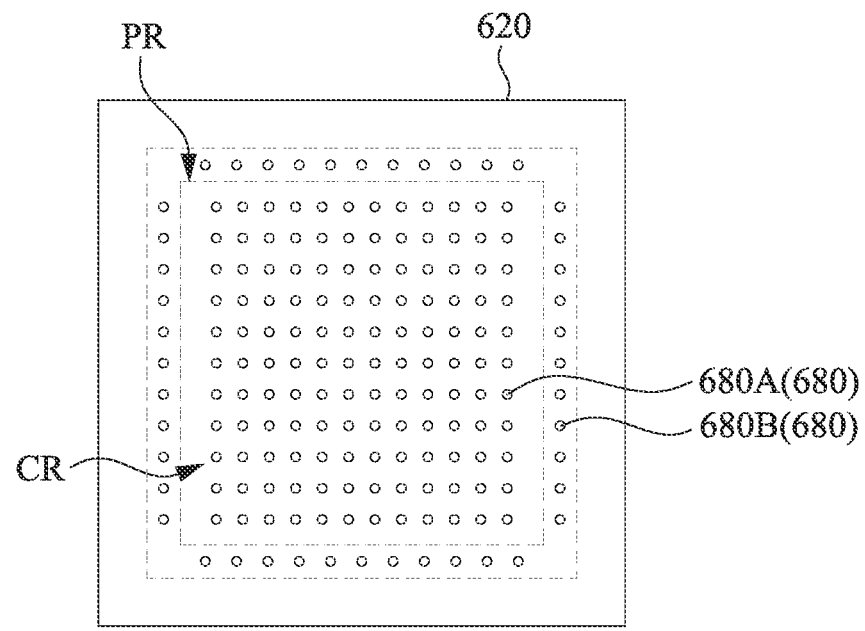
Figure 14:
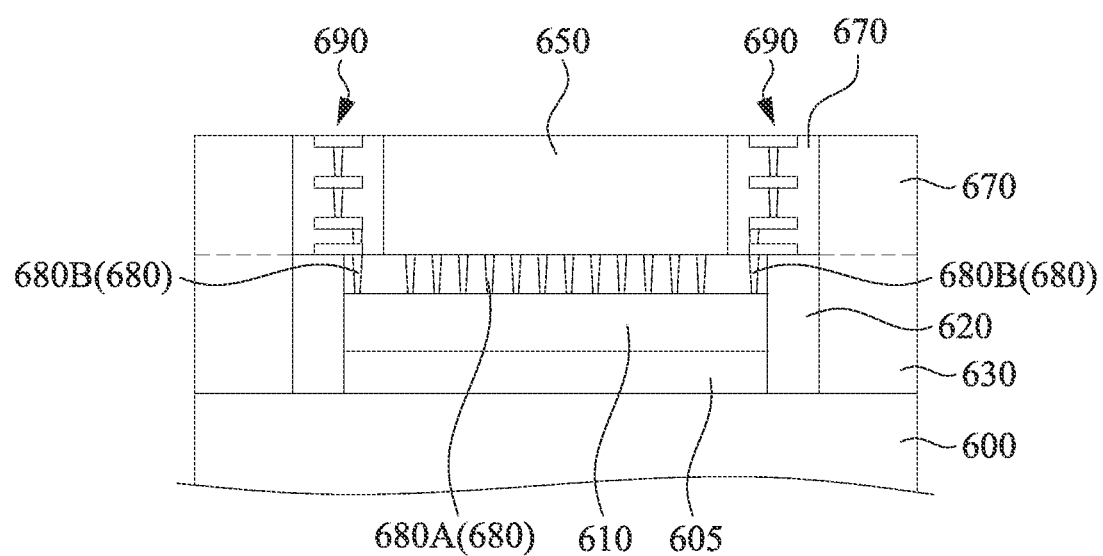

FIGS. 13A-14 illustrate a method in various stages of fabricating an integrated circuit in accordance with some embodiments of the present disclosure. FIGS. 13A-14 are similar to those described in FIGS. 5 to 12, and thus relevant structures are labeled the same and details will not be repeated for brevity.

Reference is made to FIGS. 13A and 13B, in which FIG. 13A is a cross-sectional view of an integrated circuit, and FIG. 13B is a top view of an integrated circuit. FIG. 13A is similar to FIG. 11, the difference between FIG. 13A and FIG. 11 is that a plurality of vias 680 are formed in the dielectric layer 620. In some embodiments, as shown in FIGS. 13A and 13B, the vias 680 are divided into first portions 680A and second portions 680B, in which the first portions 680A are disposed at the center region CR, and the second portions 680B are disposed at a peripheral region PR that surrounds the center region CR. As shown in FIG. 13B, when view from above, the second portions 680B of the vias 680 at the peripheral region PR encircles the first portions 680A of the vias 680 at the center region CR. In some embodiments, the first portions 680A of the vias 680 are similar to the via 670 discussed above with respect to FIGS. 11 and 12.

Reference is made to FIG. 14. FIG. 14 is similar to FIG. 12, the difference between FIG. 14 and FIG. 12 is that a plurality of interconnection structures 690 are formed in the ILD layer 660, in which the interconnection structures 690 surrounds the integrated circuit 650. In some embodiments, the first portions 680A of the vias 680 are electrically connected to the integrated circuit 650, and the second portions 680B of the vias 680 are electrically connected to the interconnection structures 690. In some embodiments, the interconnection structures 690 vertically extend through the ILD layer 660. In some embodiments, the interconnection structures 690 include metal lines and vias alternately stacked along the vertical direction.

As mentioned above, the first portions 680A at the center region CR of the vias 680 are similar to the vias 640 discussed in FIG. 12. Accordingly, the metal layer 610 can serve as the power line (e.g., power line VSS of FIGS. 1A to 1D and/or power line VSS of FIGS. 2A to 2D) of the integrated circuit 650 through the first portions 680A of the vias 680. On the other hand, the second portions 680B at the peripheral region PR of the vias 680 electrically connect the metal layer 610 to the interconnection structures 690 in the ILD layer 660. Accordingly, the metal layer 610 can not only serve as the power line of the integrated circuit 650, but can also provide interconnection purpose for the interconnection structures 690, which may be electrically connected to other functional devices (not shown) over the substrate 600. As a result, with this configuration, the routing flexibility can be improved.

Figure 15:
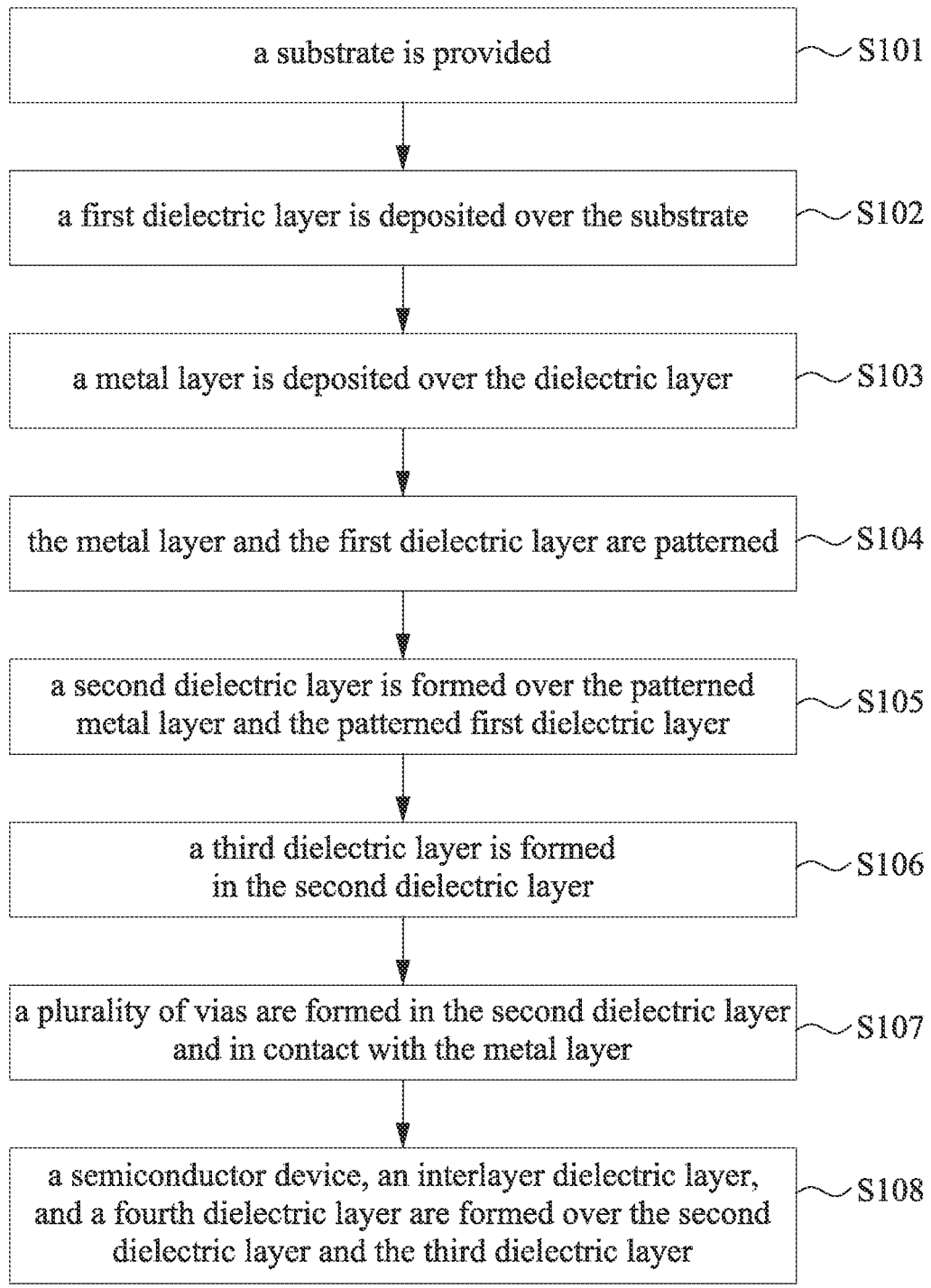
FIG. 15 illustrates a method of forming an integrated circuit in accordance with some embodiments of the present disclosure.

FIG. 15 illustrates a method M1 of forming an integrated circuit in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a substrate is provided. FIG. 5 illustrates a cross-sectional view of some embodiments corresponding to act in block S101.

At block S102, a first dielectric layer is deposited over the substrate. FIG. 6 illustrates a cross-sectional view of some embodiments corresponding to act in block S102.

At block S103, a metal layer is deposited over the dielectric layer. FIG. 7 illustrates a cross-sectional view of some embodiments corresponding to act in block S103.

At block S104, the metal layer and the first dielectric layer are patterned. FIG. 8 illustrates a cross-sectional view of some embodiments corresponding to act in block S104.

At block S105, a second dielectric layer is formed over the patterned metal layer and the patterned first dielectric layer. FIG. 9 illustrates a cross-sectional view of some embodiments corresponding to act in block S105.

At block S106, a third dielectric layer is formed in the second dielectric layer. FIG. 10 illustrates a cross-sectional view of some embodiments corresponding to act in block S106.

At block S107, a plurality of vias are formed in the second dielectric layer and in contact with the metal layer. FIG. 11 illustrates a cross-sectional view of some embodiments corresponding to act in block S107.

At block S108, a semiconductor device, an interlayer dielectric layer, and a fourth dielectric layer are formed over the second dielectric layer and the third dielectric layer. FIG. 12 illustrates a cross-sectional view of some embodiments corresponding to act in block S108.

FIGS. 16-24 illustrate a method in various stages of fabricating an integrated circuit in accordance with some embodiments of the present disclosure. Some elements described in of FIGS. 16-24 are similar to those described in FIGS. 5-12, and thus relevant structural details will not be repeated for brevity.

Figure 16:
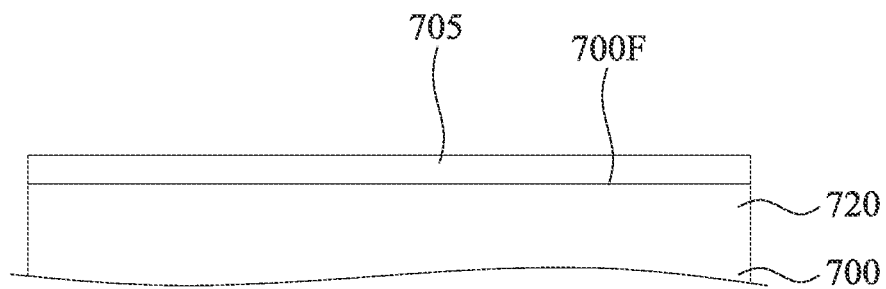
FIGS. 16-24 illustrate a method in various stages of fabricating an integrated circuit in accordance with some embodiments of the present disclosure.

Reference is made to FIG. 16. A dielectric layer 705 is formed over a front side 700F of a semiconductor substrate 700. In some embodiments, the semiconductor substrate 700 is similar to the semiconductor substrate 600 discussed above with respect to FIGS. 5-12, and the dielectric layer 705 is similar to the dielectric layer 605 discussed above with respect to FIGS. 5-12.

Figure 17:
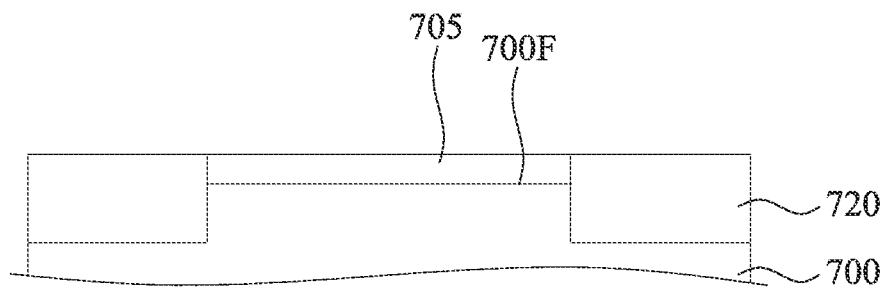

Reference is made to FIG. 17. A dielectric layer 720 is formed in the substrate 700. In some embodiments, the dielectric layer 720 may be formed by, for example, etching the dielectric layer 705 and the substrate 700 to form recesses extending through the dielectric layer 705 and the substrate 700, filling a dielectric material in the recesses and over the dielectric layer 705, and followed by a CMP process to remove excessive dielectric material until the top surface of the dielectric layer 705 is exposed. In some embodiments, the dielectric layer 720 is similar to the dielectric layer 630 discussed above with respect to FIGS. 5-12.

Figure 18:
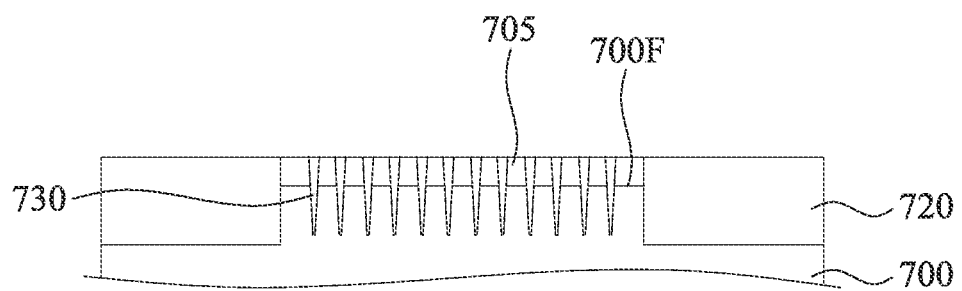

Reference is made to FIG. 18. A plurality of vias 730 are formed in the dielectric layer 705 and the substrate 700. In some embodiments, the vias 730 may be formed by, for example, patterning the dielectric layer 705 and the substrate 700 to form recesses extending though the dielectric layer 705 and into the substrate 700, filling a conductive material in the recesses and over the dielectric layer 705, and followed by a CMP process until the top surface of the dielectric layer 705 is exposed. In some embodiments, the vias 730 are similar to the vias 670 discussed above with respect to FIGS. 5-12.

Figure 19:
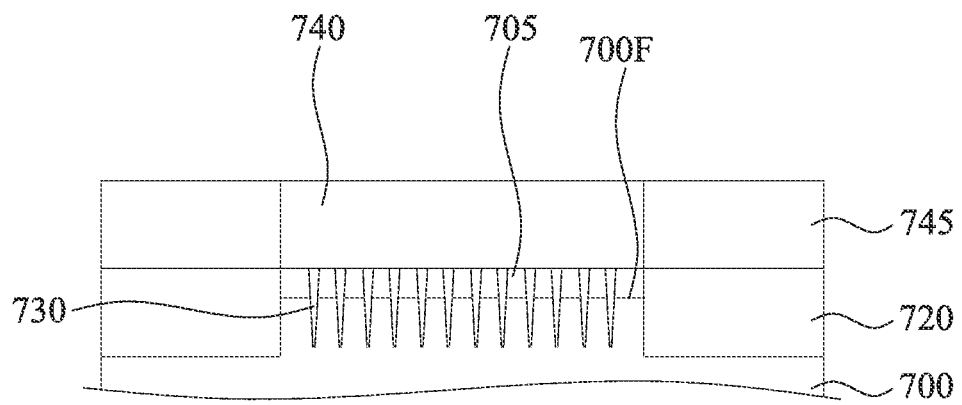

Reference is made to FIG. 19. A integrated circuit 740 and a dielectric layer 745 are formed over the front side 700F of the substrate 700. In some embodiments, the integrated circuit 740 is similar to the semiconductor device 650 discussed above with respect to FIGS. 5-12, and the dielectric layer 745 is similar to the dielectric layer 670 discussed above with respect to FIGS. 5-12. The integrated circuit 740 is formed over the dielectric layer 705 and electrically connected to the vias 730.

Figure 20:
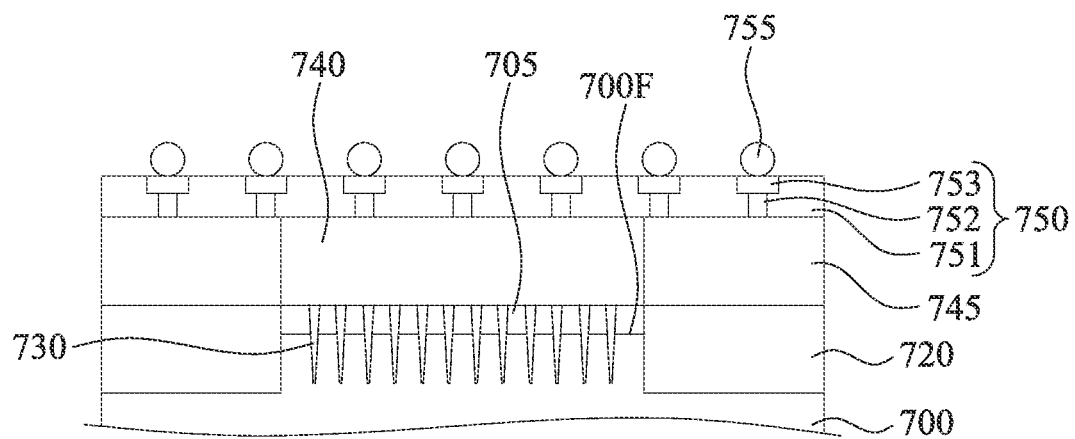

Reference is made to FIG. 20. A redistribution layer (RDL) 750 is formed over the integrated circuit 740, and bumps 755 are formed over the RDL 750. In some embodiments, the RDL 750 may include a dielectric layer 751 blanketing over the integrated circuit 740 and the dielectric layer 745. The RDL 750 further includes a plurality of vias 751 disposed in the dielectric layer 751, and portions of the vias 751 are in contact with the integrated circuit 740. The RDL 750 further includes a plurality of conductive pads 753, in which each of the conductive pads 753 is in contact with a corresponding via 751. In the embodiments of FIG. 20, one layer of vias 751 and one layer of conductive pads 753 are illustrated. However, in some other embodiments, more layers of vias and conductive pads may be employed. In some embodiments, the bumps 755 are electrically connected to the conductive pads 753, respectively. In some embodiments, the vias 751 and the conductive pads 753 may include copper (Cu), aluminum (Al), or suitable conductive material. In some embodiments, the bumps 755 may include solder material, such as Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, SnAgSb, or other suitable solder materials. In some embodiments, an under-bump-metallurgy (UBM) layer (not shown) may be formed between the bumps 755 and the conductive pads 753. The UBM layer includes a diffusion barrier layer and/or a seed layer. The diffusion barrier layer may be formed of titanium, although it may also be formed of other materials such as titanium nitride, tantalum, tantalum nitride, or the like. The seed layer may be formed of copper alloys that include silver, chromium, nickel, tin, gold, or combinations thereof. In one embodiment, the UBM layer is a Cu/Ti layer.

Figure 21:
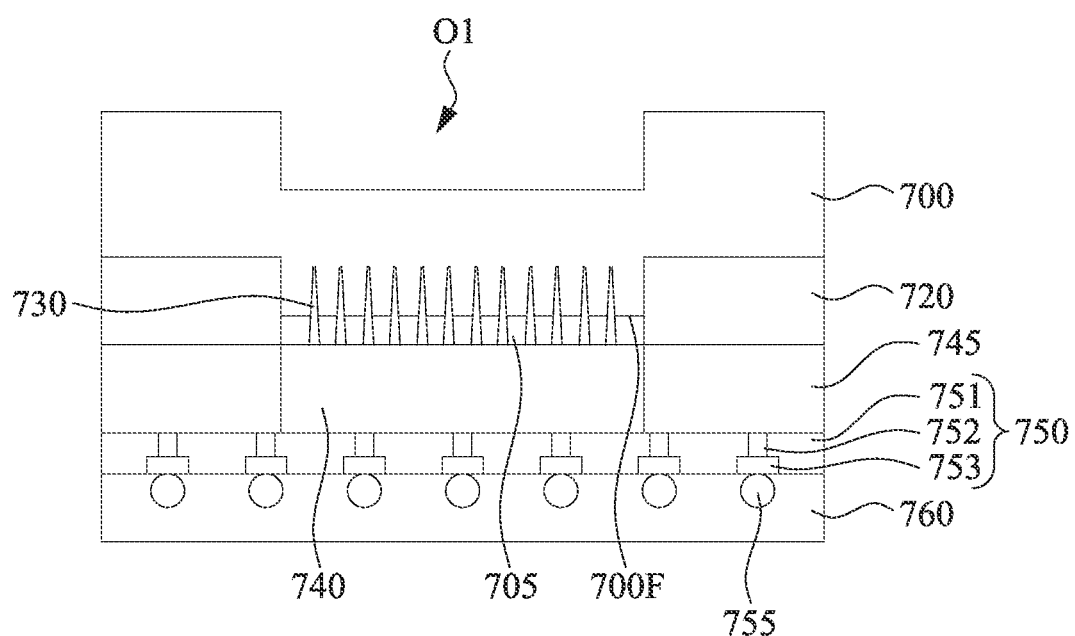

Reference is made to FIG. 21. A carrier 760 is mounted on the bumps 755, and an opening O1 is formed from the backside 700B of the substrate 700. In greater detail, the carrier 760 may be mounted to the bumps 755 through an adhesive layer (not shown). In some embodiments, the adhesive layer may be disposed, for example, laminated on the carrier 760. The adhesive layer may be formed of a glue, such as an ultra-violet glue, or may be a lamination layer formed of a foil. The carrier 760 may be suitable substrate that provides mechanical support for the layers on top. The carrier 760 may include a wafer comprising glass, silicon (e.g., a silicon wafer), silicon oxide, metal plate, a ceramic material, or the like. After the carrier 760 is mounted on the bumps 755, the substrate 700 is flipped over so that the backside 700B of the substrate 700 is toward the top of the figure. Then, the opening O1 may be formed in the substrate 700 by, for example, performing a CMP process to planarize the backside 700B of the substrate 700, forming a patterned mask that exposes a portion of the backside 700B of the substrate 700, performing an etching process to the backside 700B of the substrate 700 by using the patterned mask as an etching mask, and removing the patterned mask after the etching process.

Figure 22:
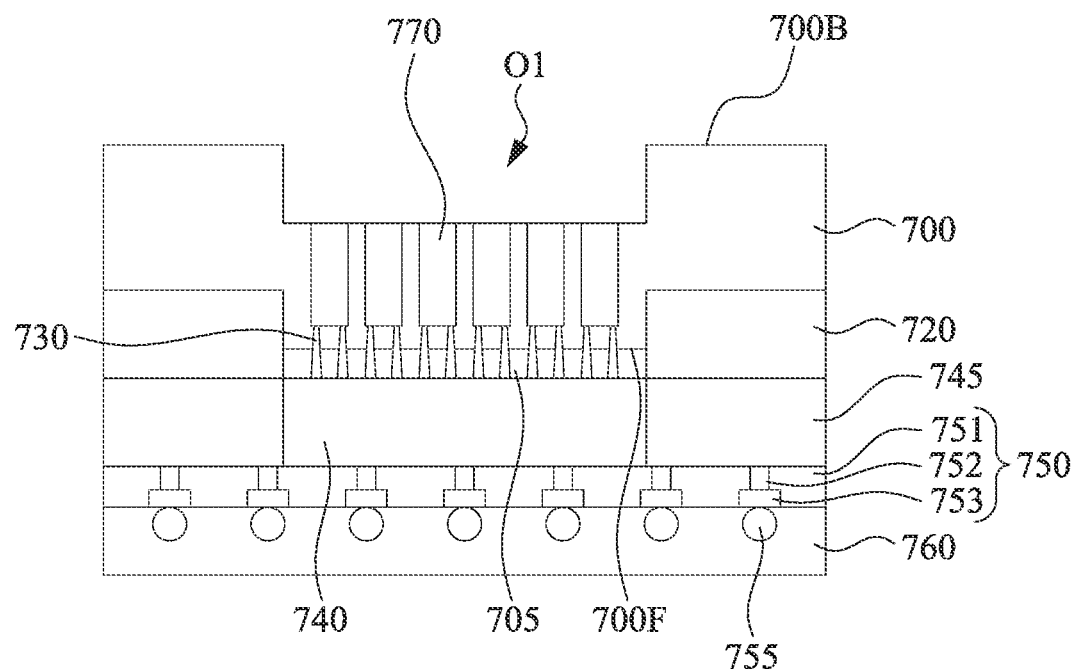

Reference is made to FIG. 22. A plurality of vias 770 are formed in the substrate 700 from the backside 700B of the substrate 700. In some embodiments, the vias 770 may be formed by, for example, etching the substrate 700 through the opening O1 to form a plurality of holes that expose the vias 730, and filling conductive material into the holes. In some embodiments of FIG. 22, each of the vias 770 is in contact with more than one via 730, such as in contact with two vias 730 as illustrated. However, in some other embodiments, the each of the vias 770 may be in contact with more or less vias 730. Because each of the vias 770 is in contact with more than one via 730, each of the vias 770 is wider than each of the vias 730. In some embodiments, the vias 770 may include copper (Cu), aluminum (Al), or suitable conductive material.

Figure 23:
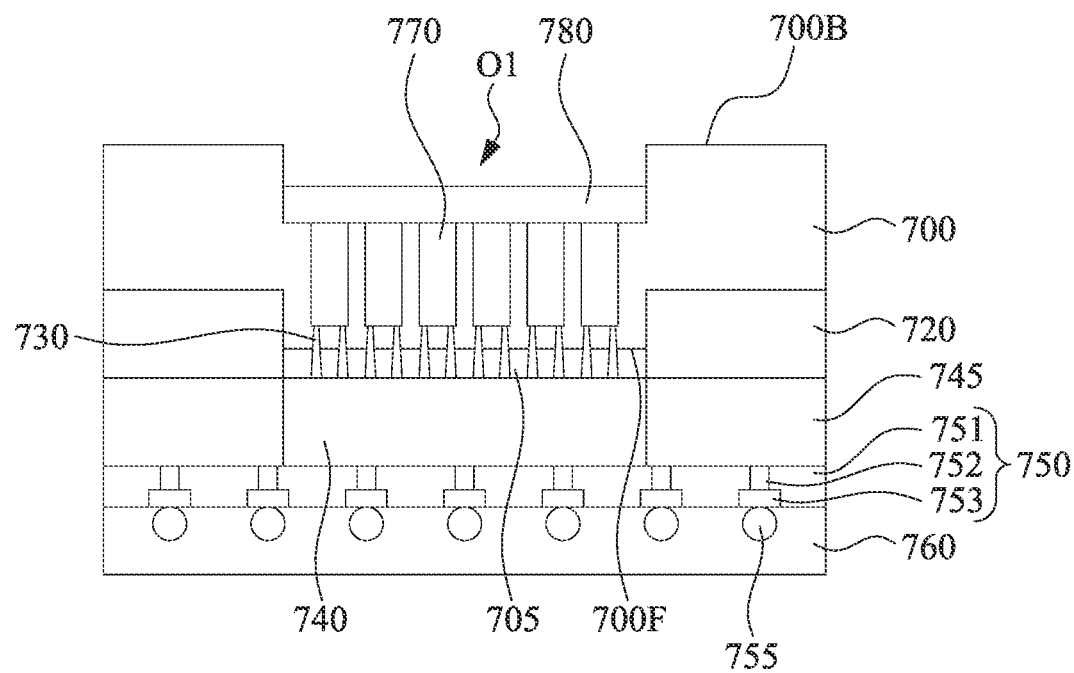

Reference is made to FIG. 23. A metal layer 780 is formed over the vias 770 and in the opening O1 of the substrate 700. The metal layer 780 is in contact with the vias 770. In some embodiments, the metal layer 780 may be formed by, for example, depositing a conductive material over the backside 700B of the substrate 700 and filling the opening O1, performing a CMP process to remove excessive conductive material until the substrate 700 is exposed, and followed by an etching back process to the conductive material. In some embodiments, the metal layer 780 may include copper (Cu), aluminum (Al), or suitable conductive material.

Figure 24:
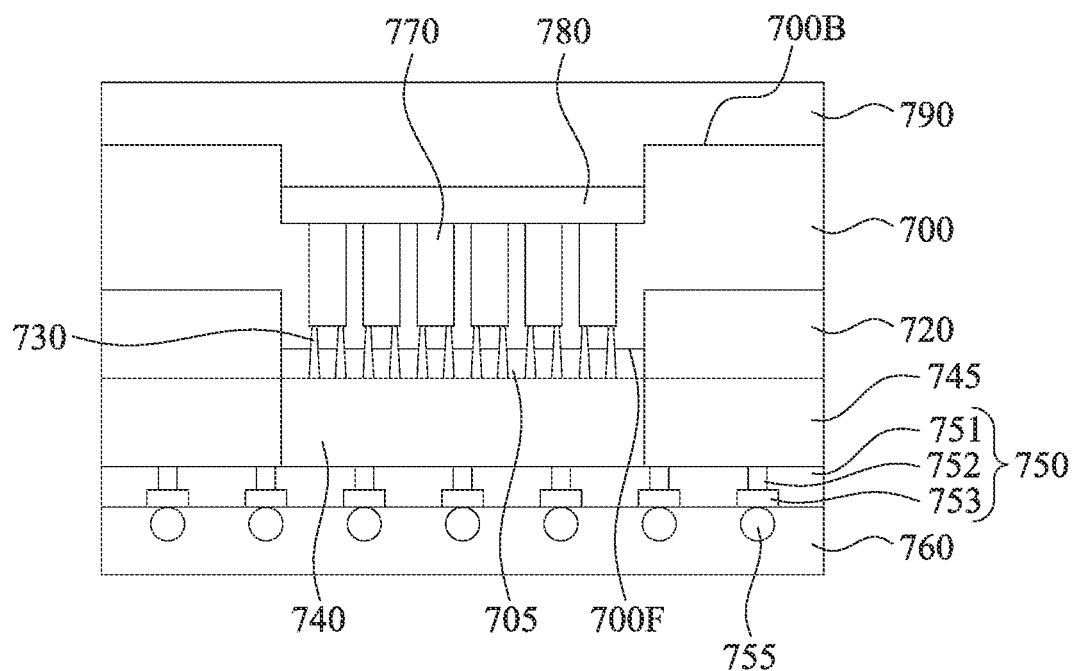

Reference is made to FIG. 24. An insulating layer 790 is formed over the backside 700B of the substrate 700 to seal to the metal layer 780. In some embodiments, the insulating layer 790 may be formed by CVD, PVD, ALD, or suitable process. The insulating layer 790 may include $SiO_2$, $Si_3N_4$, $SiO_xN_y$, fluorine-doped silicate glass (FSG), a low-k dielectric, combinations thereof, and/or other suitable materials.

In some embodiments, the metal layer 780 of FIG. 24 may serve as the power line VSS discussed in FIGS. 1A to 1F, and the vias 730 of FIG. 24 may serve as the via 130 discussed in FIGS. 1A to 1F. However, FIG. 24 is different from FIGS. 1A to 1F, in that vias 770 are further disposed between the metal layer 780 and the vias 730. On the other hand, the integrated circuit 740 of FIG. 24 may include elements of the integrated circuit IC1 of FIGS. 1A to 1F that are above the via 130 and the power line VSS of FIGS. 1A to 1F. More particularly, the integrated circuit 740 of FIG. 24 may include a second transistor T2 over front side 700F of the substrate 700, a first transistor T1 over the second transistor T2, and a power line VDD over the second transistor T2, as discussed in FIGS. 1A to 1F. Other elements are discussed above with respect to FIGS. 1A to 1F, and thus relevant structural details will not be repeated for brevity.

In some embodiments, the metal layer 780 of FIG. 24 may serve as the power line VSS discussed in FIGS. 2A to 2D, and the vias 730 of FIG. 24 may serve as the vias 261, 262 discussed in FIGS. 2A to 2D. However, FIG. 24 is different from FIGS. 2A to 2D, in that vias 770 are further disposed between the metal layer 780 and the vias 730. On the other hand, the integrated circuit 740 of FIG. 24 may include elements of the integrated circuit IC2 of FIGS. 2A to 2D that are above the vias 261, 262 and the power line VSS of FIGS. 2A to 2D. More particularly, the integrated circuit 740 of FIG. 24 may include transistors T21, T22, T23, and T24 over the front side 700F of the substrate 600, transistors T11, T12, T13, T14 over the transistors T21, T22, T23, T24, and a power line VDD over the transistors T11, T12, T13, T14, as discussed in FIGS. 2A to 2D. Other elements are discussed above with respect to FIGS. 2A to 2D, and thus relevant structural details will not be repeated for brevity.

Figure 25:
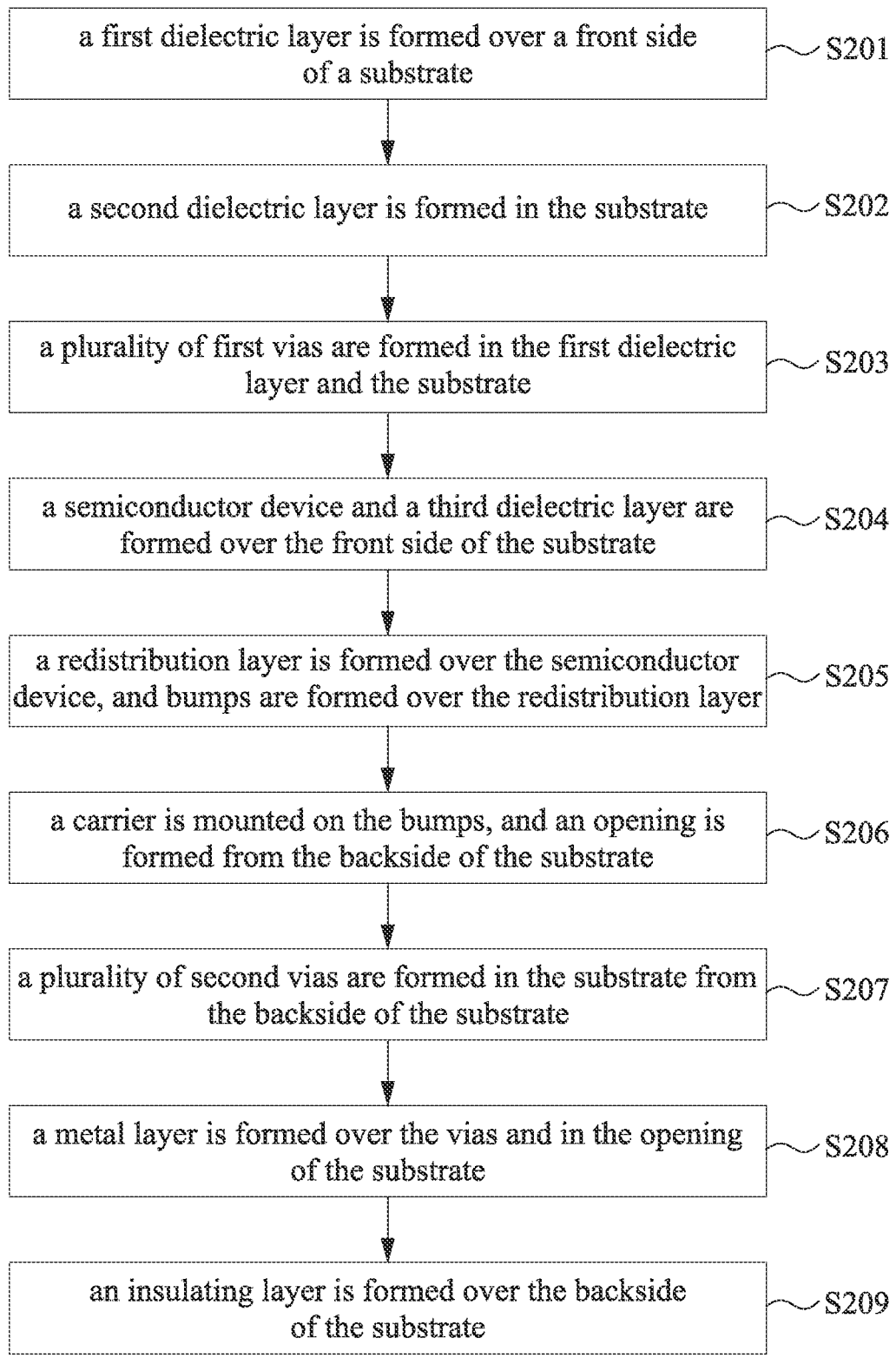
FIG. 25 illustrates a method of forming an integrated circuit in accordance with some embodiments of the present disclosure.

FIG. 25 illustrates a method M2 of forming an integrated circuit in accordance with some embodiments of the present disclosure. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S201, a first dielectric layer is formed over a front side of a substrate. FIG. 16 illustrates a cross-sectional view of some embodiments corresponding to act in block S201.

At block S202, a second dielectric layer is formed in the substrate. FIG. 17 illustrates a cross-sectional view of some embodiments corresponding to act in block S202.

At block S203, a plurality of first vias are formed in the first dielectric layer and the substrate. FIG. 18 illustrates a cross-sectional view of some embodiments corresponding to act in block S203.

At block S204, a semiconductor device and a third dielectric layer are formed over the front side of the substrate. FIG. 19 illustrates a cross-sectional view of some embodiments corresponding to act in block S204.

At block S205, a redistribution layer is formed over the semiconductor device, and bumps are formed over the redistribution layer. FIG. 20 illustrates a cross-sectional view of some embodiments corresponding to act in block S205.

At block S206, a carrier is mounted on the bumps, and an opening is formed from the backside of the substrate. FIG. 21 illustrates a cross-sectional view of some embodiments corresponding to act in block S206.

At block S207, a plurality of second vias are formed in the substrate from the backside of the substrate. FIG. 22 illustrates a cross-sectional view of some embodiments corresponding to act in block S207.

At block S208, a metal layer is formed over the vias and in the opening of the substrate. FIG. 23 illustrates a cross-sectional view of some embodiments corresponding to act in block S208.

At block S209, an insulating layer is formed over the backside of the substrate. FIG. 24 illustrates a cross-sectional view of some embodiments corresponding to act in block S209.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that power line VSS and power line VDD are disposed on opposite sides of the first transistor T1 and the second transistor T2 along the vertical direction. Further, the power line VSS has larger area than the power line VDD. With this configuration, the routing flexibility may be improved. Another advantage is that, the width of the power line VDD is formed having the critical dimension, and thus the density of the final product may be increased.

According to some embodiments of the present disclosure, an integrated circuit includes a first transistor, a second transistor, a first power line, and a second power line. The first transistor has a first active region and a first gate structure wrapping around the first active region on four sides of the first active region, in which the first active region has a source region and a drain region on opposite sides of the first gate structure. The second transistor is below the first transistor, and has a second active region and a second gate structure wrapping around the second active region on four sides of the second active region, in which the second active region has a source region and a drain region on opposite sides of the second gate structure. The first power line is above the first transistor, in which the first power line is electrically connected to the source region of first active region of the first transistor. The second power line is below the second transistor, in which the second power line is electrically connected to the source region of second active region of the second transistor.

According to some embodiments of the present disclosure, an integrated circuit includes a first power line, a complementary field effect transistor (CFET), and a second power line. The CFET is vertically above the first power line, in which the CFET includes a first transistor and a second transistor vertically above the first transistor, in which the first power line is electrically connected to a source/drain region of the first transistor. The second power line is electrically connected to a source/drain region of the second transistor.

According to some embodiments of the present disclosure, an integrated circuit includes a first power line, a complementary field effect transistor (CFET), and a second power line. The CFET is vertically above the first power line, in which the CFET includes a first transistor and a second transistor vertically above the first transistor. The second power line is vertically above the CFET, in which an area of the first power line is greater than an area of the second power line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first transistor having a first active region and a first gate structure wrapping around the first active region on four sides of the first active region, wherein the first active region has a source region and a drain region on opposite sides of the first gate structure;
a second transistor below the first transistor, and having a second active region and a second gate structure wrapping around the second active region on four sides of the second active region, wherein the second active region has a source region and a drain region on opposite sides of the second gate structure;
a first power line above the first transistor, wherein the first power line is electrically connected to the source region of first active region of the first transistor; and a second power line below the second transistor, wherein the second power line is electrically connected to the source region of second active region of the second transistor.

2. The integrated circuit of claim 1, wherein the first power line vertically overlaps the second power line.

3. The integrated circuit of claim 1, wherein the first power line extends along a first direction, and the second power line is wider than the first power line along a second direction perpendicular to the first direction.

4. The integrated circuit of claim 1, further comprising a signal line above the first transistor and electrically connected to the first gate structure of the first transistor, wherein the first power line extends along a first direction, the second power line is wider than the first power line along a second direction perpendicular to the first direction, and the first power line is wider than the signal line along the second direction.

5. The integrated circuit of claim 1, further comprising a signal line above the first transistor and electrically connected to the first gate structure of the first transistor, wherein the first power line extends along a first direction, and a width of the signal line is substantially the same as a width of the first power line along a second direction perpendicular to the first direction.

6. The integrated circuit of claim 1, wherein an area of the second power line is greater than an area of the first power line.

7. The integrated circuit of claim 1, further comprising a via between the first transistor and the second transistor, wherein the via electrically connects the first gate structure of the first transistor to the second gate structure of the second transistor.

8. The integrated circuit of claim 1, further comprising:
a first metal line adjacent to the first transistor;
a second metal line adjacent to the second transistor; and
a first via vertically between the first metal line and the second metal line, wherein the drain region of the first active region of the first transistor is connected to the drain region of the second active region of the second transistor through the first metal line, the first via, and the second metal line.

9. The integrated circuit of claim 8, further comprising:
a second via laterally between first metal line and the first transistor, wherein the second via electrically connects the drain region of the first active region of the first transistor to the first metal line; and
a third via laterally between second metal line and the second transistor, wherein the third via electrically connects the drain region of the second active region of the second transistor to the first metal line.

10. The integrated circuit of claim 1, wherein the first transistor and the second transistor have different conductivity types.

11. An integrated circuit, comprising:
a first power line;
a complementary field effect transistor (CFET) vertically above the first power line, wherein the CFET comprises:
a first transistor, wherein the first power line is electrically connected to a source/drain region of the first transistor; and
a second transistor vertically above the first transistor;
a second power line electrically connected to a source/drain region of the second transistor; and
a signal line at a same level as the second power line, wherein the signal line is electrically connected to the second transistor.

12. The integrated circuit of claim 11, wherein the first transistor and the second transistor each comprises:
an active region; and
a gate structure wrapping around a channel region of the active region.

13. The integrated circuit of claim 11, wherein an area of the first power line is greater than an area of the second power line.

14. The integrated circuit of claim 11, wherein the first power line vertically overlaps the second power line.

15. The integrated circuit of claim 11, wherein the first transistor and the second transistor have a gate-all-around (GAA) configuration.

16. An integrated circuit, comprising:
a first power line;
a complementary field effect transistor (CFET) vertically above the first power line, wherein the CFET comprises:
a first transistor; and
a second transistor vertically above the first transistor; and
a second power line vertically above the CFET, wherein an area of the first power line is greater than an area of the second power line.

17. The integrated circuit of claim 16, wherein the first transistor and the second transistor have a gate-all-around (GAA) configuration.

18. The integrated circuit of claim 16, wherein the first power line vertically overlaps the second power line.

19. The integrated circuit of claim 16, further comprising:
a first signal line at a same level as the second power line, wherein the first signal line is electrically connected to a first source/drain region of the of the first transistor and a second source/drain region of the second transistor; and
a second signal line at a same level as the second power line, wherein the second signal line is electrically connected to a first gate structure of the first transistor and a second gate structure of the second transistor.

20. The integrated circuit of claim 19, wherein the first power line vertically overlaps the first and second signal lines.

* * * * *